US008567605B2

(12) United States Patent
Kakimoto et al.

(10) Patent No.: US 8,567,605 B2
(45) Date of Patent: Oct. 29, 2013

(54) METHOD OF STORING LIQUID COMPOSITION FOR ORGANIC SEMICONDUCTOR ELEMENT

(75) Inventors: Hidenobu Kakimoto, Tsukuba (JP); Hiroyuki Saito, Tsukuba (JP)

(73) Assignee: Sumitomo Chemical Company, Limited, Tokyo (JP)

(*) Notice: Subject to any disclaimer, the term of this patent is extended or adjusted under 35 U.S.C. 154(b) by 286 days.

(21) Appl. No.: 13/006,036

(22) Filed: Jan. 13, 2011

(65) Prior Publication Data
US 2011/0204344 A1    Aug. 25, 2011

(30) Foreign Application Priority Data
Jan. 15, 2010  (JP) .................................. 2010-7303

(51) Int. Cl.
B65D 85/84        (2006.01)
(52) U.S. Cl.
USPC ........................................................ 206/524.6
(58) Field of Classification Search
USPC ............. 257/40, E51.018; 206/524.1, 524.6; 222/1, 94, 95, 105; 438/47, 94, 905
See application file for complete search history.

(56) References Cited

U.S. PATENT DOCUMENTS

| | | | |
|---|---|---|---|
| 4,856,650 A * | 8/1989 | Inoue | 206/204 |
| 4,919,834 A * | 4/1990 | Chen et al. | 206/524.6 |
| 6,698,619 B2 * | 3/2004 | Wertenberger | 222/94 |
| 6,843,285 B2 * | 1/2005 | Ozawa | 141/326 |
| 2006/0088680 A1 * | 4/2006 | Kitahara et al. | 428/36.9 |
| 2008/0314785 A1 * | 12/2008 | Hsieh | 206/524.6 |
| 2010/0276672 A1 * | 11/2010 | Imai et al. | 257/40 |

FOREIGN PATENT DOCUMENTS

| | | |
|---|---|---|
| JP | 2001-288416 A | 10/2001 |
| JP | 2004-031077 A | 1/2004 |
| JP | 2004-119351 A | 4/2004 |

* cited by examiner

Primary Examiner — Vongsavanh Sengdara
(74) Attorney, Agent, or Firm — Sughrue Mion, PLLC

(57) ABSTRACT

Problem to be solved by the present invention is to prevent volatilization of an organic solvent while a liquid composition for an organic semiconductor device is stored by placing in a container, and to prevent deterioration in function of an organic compound for forming an organic semiconductor device. Means for solving the problem is a method of storing a liquid composition for an organic semiconductor device comprising the step of storing the liquid composition for an organic semiconductor device containing an organic compound for forming an organic semiconductor device, and an organic solvent, in a container having a container body, a packing covering an opening part of the container body, and a lid, wherein the container body has an inner wall formed of a material which does not chemically act on the organic solvent nor on the organic compound, and a surface of the packing, which covers the opening part and which comes into contact with the opening-periphery part when the packing and the lid are mounted to the container body to form a sealed state, is formed of a material containing a resin having fluorine atom.

12 Claims, 2 Drawing Sheets

METHOD OF STORING LIQUID COMPOSITION FOR ORGANIC SEMICONDUCTOR ELEMENT

CROSS-REFERENCE TO RELATED APPLICATION

This application relates to and claims the benefit of priority from Japanese Patent Application number 2010-7303, filed on Jan. 15, 2010, the entire disclosure of which is incorporated herein by reference.

TECHNICAL FIELD

The present invention relates to a method of storing a liquid composition for an organic semiconductor device, particularly, a method of storing a liquid composition for an organic electroluminescent device.

BACKGROUND ART

In recent years, the technique using an organic semiconductor device has been attracting attention and, particularly, an organic EL display using an organic electroluminescent (hereinafter, referred to as "organic EL" in some cases) device which is one embodiment of the organic semiconductor device has been attracting attention. An organic EL device used in the organic EL display is constituted by including an anode, a cathode, and a light emitting layer which is arranged between the anode and the cathode, and holes and electrons which are injected from the anode and the cathode, respectively, are bound in the light emitting layer, thereby, to emit light.

The organic EL device has advantages that a manufacturing step is easy, and an organic layer such as a light emitting layer can be formed by an applying method which is easy in scaling the area up. For example, the organic EL device can be manufactured by applying a liquid composition for an organic semiconductor device obtained by dissolving or dispersing a material for forming an organic layer in an organic solvent, to a substrate having a surface on which an anode has been formed, drying it to form an organic layer, and forming a cathode layer thereon (for example, the patent documents 1, 2 and 3).

Examples of the material for forming an organic layer include organic compounds for forming an organic semiconductor device such as light emitting compounds constituting a light emitting layer and hole injecting compounds constituting a hole injecting layer. As a means for forming the liquid composition for an organic semiconductor device, it is used, for example, a wet applying method using an applying apparatus such as a spin coating method or an inkjet method.

A functional organic compound such as the organic compound for forming an organic semiconductor device is generally poor in storage stability. For this reason, particularly, when the compound is made to be liquid by adding an organic solvent, the function deteriorates comparatively early by influence of impurities or pollution substances.

A container which stores the liquid composition for an organic semiconductor device is provided with an openable and closable lid and a packing which covers an opening part of a container body, for preventing volatilization of organic solvents or contamination of pollution substances, while convenience at use is maintained.

However, when the liquid composition for an organic semiconductor device is stored in a conventional storage container, the function of the organic compound for forming an organic semiconductor device easily deteriorates. For example, an organic EL device manufactured using the liquid composition for an organic semiconductor device after storage becomes short in luminance half life.

BACKGROUND ART DOCUMENTS

Patent Documents

Patent Document 1: Japanese Patent Laid-open Publication No. 2004-31077
Patent Document 2: Japanese Patent Laid-open Publication No. 2004-119351
Patent Document 3: Japanese Patent Laid-open Publication No. 2001-288416

DISCLOSURE OF THE INVENTION

Problem to be Solved by the Invention

It is an object of the present invention to prevent deterioration in function of an organic compound for forming an organic semiconductor device while a liquid composition for an organic semiconductor device is stored in a container.

Means for Solving the Problems

In view of the aforementioned problems, the present inventors have intensively studied and have found out that volatilization of an organic solvent and deterioration in function of an organic compound for forming an organic semiconductor device can be prevented effectively by making the storage container have an inner wall formed of the materials which do not chemically act, and by forming the surface of the packing of the storage container of the materials comprising a resin having fluorine atom.

That is, the present invention provides a method of storing a liquid composition for an organic semiconductor device, the method including the step of storing the liquid composition for an organic semiconductor device comprising an organic compound for forming an organic semiconductor device which is solid at 1 atm and 25° C., and an organic solvent which is liquid at 1 atm and 25° C., in a storage container having a container body which defines a cavity as a space for storing therein a substance to be stored, and which has an opening-periphery part defining an opening part for connecting the cavity and the outside of the container, a packing which covers the opening part of the container body, and a lid, wherein the container body has an inner wall formed of a material which does not chemically act on the organic solvent and the organic compound, and a surface of the packing, which surface covers the opening part and which comes into contact with the opening-periphery part when the packing and the lid are mounted to the container body to form a sealed condition, is formed of a material containing a resin having fluorine atom.

In one embodiment, the organic semiconductor device is an organic electroluminescent device.

In one embodiment, the material forming the inner surface of the container body is glass.

In one embodiment, the organic compound is a high-molecular compound.

In one embodiment, the organic solvent is a compound composed of two or more elements selected from the group consisting of carbon, hydrogen, oxygen and nitrogen.

In one embodiment, the organic compound is contained in the liquid composition in a proportion of not less than 0.01% by weight and not more than 5.0% by weight based on the total weight of the liquid composition.

In one embodiment, the resin having fluorine atom is at least one selected from the group consisting of polymonofluoroethylene, polydifluoroethylene, polytrifluoroethylene, polytetrafluoroethylene and a tetrafluoroethylene/hexafuoropropylene copolymer.

In one embodiment, the liquid composition is stored at a temperature of not lower than 0° C. and not higher than 50° C.

In one embodiment, the liquid composition is stored with light having a wavelength of not longer than 380 nm being shielded.

In one embodiment, the liquid composition is stored under an atmosphere containing an inert gas.

In one embodiment, the organic compound is an organic compound to be used for forming a light emitting layer of an organic electroluminescent device.

In one embodiment, the organic compound is an organic compound to be used for forming a charge transporting layer of an organic electroluminescent device.

Also, the present invention provides an organic electroluminescent device having a first electrode, a second electrode, and an organic layer provided between the first electrode and the second electrode, wherein the organic layer is a layer formed by applying a liquid composition stored by any one of the above described methods on the first electrode, and the liquid composition is a composition containing an organic compound which is solid at 1 atm and 25° C., and an organic solvent which is liquid at 1 atm and 25° C.

Effect of the Invention

When a liquid composition for an organic semiconductor device is stored by the method of the present invention, deterioration in performance of the resulting organic semiconductor device is in a smaller degree as compared with the case where the liquid composition has not been stored. For this reason, according to the present invention, it becomes possible to store a liquid composition for an organic semiconductor device stably for a long term.

EMBODIMENT FOR CONDUCTING THE INVENTION

Method of Storing Liquid Composition for Organic Semiconductor Device

Figure 3:
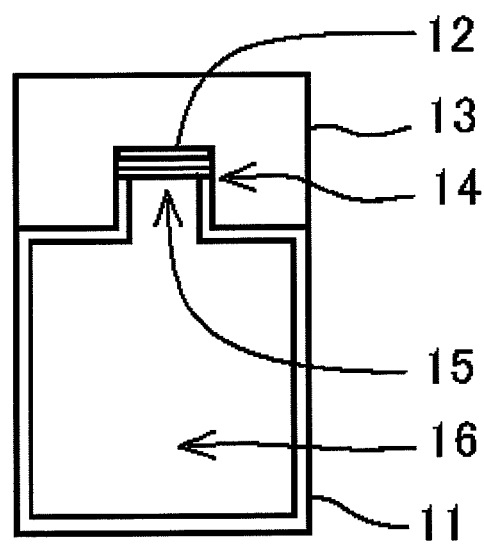
FIG. 3: A cross-sectional view schematically showing one embodiment of a storage container employed for a method of the present invention.

FIG. 3 is a cross-sectional view schematically showing one embodiment of a storage container to be employed for a method of the present invention. The storage container has a container body 11, a packing 12 and a lid 13.

The container body 11 is a member that holds a liquid composition for an organic semiconductor device during storage. The container body 11 is, for example, a bottle-shaped container which defines a cavity 16, a space for storing therein a substance to be stored and which has an opening-periphery part 14 defining an opening part 15 for connecting the cavity and the outside of the container. The liquid composition for an organic semiconductor device as a substance to be stored is charged through the opening part 15 of the container body, and is retained in contact with an inner wall of the container body. For this reason, the inner wall of the container body is formed of a material which does not influence on the components of the liquid composition for an organic semiconductor device. Since the components of the liquid composition for an organic semiconductor device are an organic compound for forming an organic semiconductor device and an organic solvent, it is required that the material of the inner wall of the container body does not chemically act on the organic compound for forming an organic semiconductor device or the organic solvent.

In the container body, at least the inner wall part is formed of a material excellent in chemical stability. Examples of the material include glass, a metal which is not dissolved in an organic solvent, a resin having fluorine atom and plastics which are not dissolved in an organic solvent. Among them, glass is preferred, a brown glass is more preferred. The capacity of the container body is not particularly limited, but it is usually a capacity such that a liquid composition of not less than 2 ml can be stored.

The packing to be used in the method of the present invention is a member which tightly closes the container The packing covers the opening part of the container body, comes into contact with an opening-periphery part, and is brought into tight contact with the opening-periphery part by being pushed with the inner surface of the lid. The material of the packing has flexibility and elasticity to an extent such that it can come into tight contact with the periphery of the opening part of the container body without forming gaps. The packing is formed of a material excellent in chemical stability so that the liquid composition for an organic semiconductor device may not be deteriorated nor qualitatively changed during the term of storage.

A surface of the packing, particularly, the surface of the packing which can come into contact with the liquid composition for an organic semiconductor device during storage is formed of a material having liquid repellency. This prevents the organic solvent from permeating into the packing and also prevents a phenomenon in which the organic solvent passes through the packing to volatize or a phenomenon in which a low-molecular compound is eluted from such as packing or lid from occurring during storage.

As a result, even when the liquid composition for an organic semiconductor device is stored, increase in concentration of the liquid composition for an organic semiconductor device is suppressed, the function of the organic compound for forming an organic semiconductor device is maintained, and the performance of a formed organic semiconductor device is also maintained.

Examples of the material having liquid repellency include materials containing a resin having fluorine atom. The material of the packing may contain other resins, as far as a resin having fluorine atom is contained. Particularly, it is preferable that a resin having fluorine atom is contained in the material of a surface of the packing, which covers the opening part of the container body and which contacts with the opening-periphery part, and the packing having a surface coated with a resin having fluorine atom is more preferable.

Examples of the resin having fluorine atom include polymonofluoroethylene, polydifluoroethylene, polytrifluoroethylene, polytetrafluoroethylene, and a tetrafluoroethylene/ hexafluoropropylene copolymer. Further, the resin may be a copolymer obtained by copolymerizing a monomer having fluorine atom which is to be a raw material of the polymers, and a monomer copolymerizable with the monomer. Preferred are polymonofluoroethylene, polydifluoroethylene, polytrifluoroethylene and polytetrafluoroethylene, and more preferred is polytetrafluoroethylene.

The material of the lid is not particularly limited, but examples thereof include glass, metal and plastics. The material is enough if airtightness in the container can be secured and it can be appropriately selected from the above materials. Among them, preferred are plastics.

The method of storing a liquid composition for an organic semiconductor device of the present invention is a method of storing the liquid composition for an organic semiconductor device in a sealed container. By storing the liquid composition in a sealed container, volatilization of a solvent, pollution of impurities from the outside etc. can be prevented.

In the method of storing a liquid composition for an organic semiconductor device of the present invention, the temperature for storage of the sealed container itself in which the liquid composition for an organic semiconductor device is stored varies depending on the boiling point of the organic solvent contained in the liquid composition, and the liquid composition can be stored at a temperature lower than the boiling point. From the viewpoint of the stability of the liquid composition, the temperature is preferably not lower than −20° C. and not higher than 50° C., more preferably not lower than 0° C. and not higher than 50° C.

In the method of storing a liquid composition for an organic semiconductor device of the present invention, the liquid composition may be stored without shielding light or may be stored while shielding light. From the viewpoint of the stability of the liquid composition, it is preferable to store the liquid composition with light having a wavelength of not longer than 380 nm being shielded, and it is more preferable to store the composition with light having a wavelength of not longer than 500 nm being shielded. It is more preferable to store the composition with light having a wavelength of not longer than 800 nm being shielded. As to a storage method with shielding of light, a sealed container in which the liquid composition for an organic semiconductor device is stored may be placed, as a whole, under a light shielding state, or the liquid composition for an organic semiconductor device may be placed in a light shielding container.

In the method of storing a liquid composition for an organic semiconductor device of the present invention, the atmosphere in the sealed container in which the liquid composition for an organic semiconductor device is stored may be an atmosphere containing an inert gas. The atmosphere may be an atmospheric environment or an atmosphere in which a concentration of the inert gas in the atmosphere is not less than a concentration of the inert gas contained in the atmospheric environment. Further, the atmosphere may be an atmosphere in which a concentration of the inert gas in the atmosphere is not less than 99% as expressed by a volumetric ratio. Examples of the inert gas include helium gas, argon gas, nitrogen gas, and a mixed gas thereof.

Then, a liquid composition for an organic semiconductor device which is to be stored by the method of storing a liquid composition for an organic semiconductor device of the present invention will be described. The liquid composition is a liquid composition for an organic semiconductor device. The liquid composition for an organic semiconductor device in the present invention represents a liquid composition which can be used for manufacturing a device capable of exhibiting a nature as a semiconductor and, specific examples thereof include a liquid composition for an organic electroluminescent device, a liquid composition for an organic field effect transistor, and a liquid composition for an organic solar cell. Among the liquid compositions for an organic semiconductor device, preferably, the liquid composition is used as a liquid composition for an organic electroluminescent device.

Regarding the concentration of the organic compound for forming an organic semiconductor device contained in the liquid composition for an organic semiconductor device, the organic compound is preferably contained in a proportion of not less than 0.01% by weight and not more than 10.0% by weight based on the total weight of the liquid composition for an organic semiconductor device. More preferably, it is contained at a proportion of not less than 0.01% by weight and not more than 5.0% by weight. More preferably, it is contained at a proportion of not less than 0.1% by weight and not more than 5.0% by weight. A preferable viscosity of the liquid composition for an organic semiconductor device is different depending on a method of forming a film, but generally, a range of from 0.5 to 500 mPa·s at 25° C. is preferable. In the case of a method of applying the liquid composition for an organic semiconductor device via a discharging apparatus such as an inkjet printing method, it is preferable that the viscosity is in a range of from 0.5 to 20 mPa·s at 25° C.

As a method of forming a film using the liquid composition for an organic semiconductor device, applying methods such as a spin coating method, a casting method, a microgravure coating method, a gravure coating method, a bar coating method, a roll coating method, a wire bar coating method, a dip coating method, a spray coating method, a screen printing method, a flexo printing method, an offset printing method, a gravure printing method and an inkjet printing method can be used.

Then, an organic solvent which is one of the constituent elements of the liquid composition for an organic semiconductor device will be described. The organic solvent is an organic compound which is liquid at 1 atm and 25° C.

The organic solvent is not particularly limited, as far as it is liquid at 1 atm and 25° C., but is preferably a compound composed of two or more kinds of elements selected from the group consisting of carbon, hydrogen, oxygen, nitrogen, and sulfur, more preferably a compound composed of two or more kinds of elements selected from the group consisting of carbon, hydrogen, oxygen and nitrogen, more preferably a compound composed of two or more kinds of elements selected from the group consisting of carbon, hydrogen and oxygen.

Examples of the organic solvent include halogenated solvents, hydrocarbon solvents, aromatic hydrocarbon solvents, ether solvents, alcohol solvents, ketone solvents, nitrile solvents, sulfoxide solvents, and amide solvents. Two or more of these organic solvents may be used in combination.

Examples of the halogenated solvents include carbon tetrachloride, methylene chloride, chloroform, dichloroethane, tetrachloroethylene, chlorobenzene, bis(2-chloroethyl)ether, chloromethyl ethyl ether, chloromethyl methyl ether, 2-chloroethyl ethyl ether, and 2-chloroethyl methyl ether.

Examples of the hydrocarbon solvents include pentane, hexane, cyclohexane, heptane, octane, decahydronaphthalene, petroleum ether, ligroin, and bicyclohexyl.

Examples of the aromatic hydrocarbon solvents include benzene, toluene, xylene, ethylbenzene, cumene, pseudocumene, mesitylene, butylbenzene, tetramethylbenzene, tert-butylbenzene, hexylbenzene, heptylbenzene, octylbenzene, nonylbenzene, decathylbenzene, tetralin, cyclohexylbenzene, decalin, and methylnaphthalene.

Examples of the ether solvents include diethyl ether, ethyl propyl ether, dipropyl ether, diisopropyl ether, dibutyl ether, methyl tert-butyl ether, anisole, methylanisole, diphenyl ether, phenoxytoluene, phenoxyxylene, ditolyl ether, tetrahydrofuran, dihydrofuran, dioxane, tetrahydropyran, 4-methyl-1,3-dioxane, and 4-phenyl-1,3-dioxane.

Examples of the alcohol solvents include methanol, ethanol, 1-propanol, 2-propanol, 1-butanol, 2-butanol, 2-methyl-1-propanol, 2-methyl-2-propanol, 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethylbutanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methylcyclohexanol, 3-methylcyclohexanol, and 4-methylcyclohexanol.

Examples of the ketone solvents include acetone, methyl ethyl ketone, methyl isobutyl ketone, cyclohexanone, isopropyl methyl ketone, 2-pentanone, 3-pentanone, 3-hexanone, diisopropyl ketone, 2-hexanone, cyclopentanone, 4-heptanone, iso-amyl methyl ketone, 3-heptanone, 2-heptanone, 4-methoxy-4-methyl-2-pentanone, 5-methyl-3-heptanone, 2-methylcydohexanone, diisobutyl ketone, 5-methyl-2-ocatanone, 3-methylcyclohexanone, 2-cydohexene-1-one, 4-methylcyclohexanone, cycloheptanone, 4-tert-butylcyclohexanone, and benzylacetone.

Examples of the nitrile solvents include acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanenitrile, glycolonitrile, benzonitrile, ethylenecyanohydrin, succinonitrile, acetonecyanohydrin, and 3-n-butoxypropionitrile.

Examples of the sulfoxide solvents include dimethyl sulfoxide, di-n-butyl sulfoxide, tetramethylene sulfoxide, and methylphenyl sulfoxide.

Examples of the amide solvents include dimethylformamide, dimethylacetamide, acylamide, 2-acetamidoethanol, N,N-dimethyl-m-toluamide, trifluoroacetamide, N,N-dimethylacetamide, N,N-diethyldodecaneamide, epsilon-caprolactam, N,N-diethylacetamide, N-tert-butylformamide, formamide, pivalamide, N-butylamide, N,N-dimethylacetoacetamide, N-methylformamide, N,N-diethylformamide, N-formylethylamine, acetamide, N,N-diisopropylformamide, 1-formylpiperidine, and N-methylformanilide.

Among them, examples of a preferable organic solvent include aromatic hydrocarbon solvents, ether solvents, and ketone solvents. Particularly preferable organic solvents are toluene, xylene, mesitylene, cyclohexylbenzene, decalin, methylanisole, diphenyl ether, phenoxytoluene, and cyclohexanone. This is because these organic solvents deteriorate, particularly, the performance of an organic semiconductor device in a conventional storage method. Two or more organic solvents may be used in combination.

When two or more kinds of organic solvents are contained in the liquid composition for an organic semiconductor device, it is preferable, from the viewpoint of film-forming property, that one kind of solvent is a solvent having a boiling point of not lower than 180° C., and the other one kind of solvent is a solvent having a boiling point of not higher than 180° C., and it is more preferable that one kind of solvent is a solvent having a boiling point of not lower than 200° C., and the other one kind of solvent is a solvent having a boiling point of not higher than 180° C.

When three kinds of organic solvents are contained in the liquid composition for an organic semiconductor device, it is preferable, from the viewpoint of film-forming property, that at least one kind of solvent among three kinds of solvents is a solvent having a boiling point of not lower than 180° C., and at least one kind of solvent is a solvent having a boiling point of not higher than 180° C., and it is more preferable that at least one kind of solvent among three kinds of solvents is a solvent having a boiling point of not lower than 200° C. and not higher than 300° C., and at least one kind of solvent is a solvent having a boiling point of not higher than 180° C.

Then, the organic compound for forming an organic semiconductor device which is one of the constituent elements of the liquid composition for an organic semiconductor device will be described. The organic compound is an organic compound which is solid at 1 atm and 25° C.

It is preferable that the organic compound is a light emitting material which mainly emits fluorescence and/or phosphorescence. For the purpose of assisting the light emitting material, the liquid composition for an organic semiconductor device may contain a dopant. The dopant is added, for example, for improving a light emitting efficiency of the organic EL device, or changing a light emitting wavelength. In addition, the organic compound may be a low-molecular compound or a high-molecular compound and, it is preferable that the organic compound is a low-molecular compound and/or a high-molecular compound, which can form a film by applying the liquid composition.

A high-molecular compound having a polystyrene-equivalent number average molecular weight of from $10^3$ to $10^8$ is more preferable. Examples of the low-molecular compound include distyrylarylene derivatives, oxadiazole derivatives and carbazole derivatives represented by CBP. Examples of the high-molecular compound include polyp araphenylenevinylene derivatives, polythiophene derivatives, polyp araphenylene derivatives, polysilane derivatives, polyacetylene derivatives, polyfluorene derivatives, polyvinylcarbazole derivatives, and the following pigment-based dopant materials and metal complex-based dopant materials, which have been high-molecularized.

Among the light emitting materials, examples of a material which emits blue light include distyrylarylene derivatives, oxadiazole derivatives, and polymers thereof, polyvinylcarbazole derivatives, polyparaphenylene derivatives and polyfluorene derivatives. Among them, polyvinylcarbazole derivatives, polyparaphenylene derivatives and polyfluorene derivatives, which are high-molecular materials, are preferable.

In addition, examples of a material which emits green light include quinacridone derivatives, coumarin derivatives, and polymers thereof, polyp araphenylenevinylene derivatives, and polyfluorene derivatives. Among them, polyp araphenylenevinylene derivatives and polyfluorene derivatives, which are high-molecular materials, are preferable.

In addition, examples of a material which emits red light include coumarin derivatives, thiophene ring compounds, and polymers thereof, polyp araphenylenevinylene derivatives, polythiophene derivatives, and polyfluorene derivatives. Among them, polyparaphenylenevinylene derivatives, polythiophene derivatives and polyfluorene derivatives, which are high-molecular materials, are preferable.

Examples of the pigment-based dopant materials include cyclopendamine derivatives, tetraphenylbutadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, trifumanylamine derivatives, oxadiazole dimers, pyrazoline dimers, quinacridone derivatives, coumarin derivatives, rubrene derivatives, squalium derivatives, porphyrin derivatives, tetracene derivatives, pyrazolone derivatives, decacyclene, and phenoxazone.

Examples of the metal complex-based dopant materials include metal complexes having Al, Zn, Be, or rare earth metals such as Tb, Eu and Dy as a central metal, and having an oxadiazole, thiadiazole, phenylpyridine, phenylbenzimidazole or quinoline structure as a ligand, metal complexes having luminescence from the triplet excited state such as iridium complexes and platinum complexes, alumiquinolinol complexes, benzoquinolinol beryllium complexes, benzoxazolyl zinc complexes, benzothiazole zinc complexes, azomethyl zinc complexes, porphyrin zinc complexes, and europium complexes.

The liquid composition for an organic semiconductor device may further contain an additive for adjusting viscosity and/or surface tension, and an antioxidant.

Examples of the additive for adjusting viscosity and/or surface tension which may be contained in the liquid composition for an organic semiconductor device include high-molecular weight compounds for increasing viscosity (viscosity increasing agents) and poor solvents, low-molecular weight compounds for decreasing viscosity, and surfactants for decreasing surface tension, and these additives may be used in appropriate combination.

The high-molecular weight compounds may be any compounds as far as they do not inhibit light emission and charge transportation, and are usually soluble in the organic solvent which is one of the constituent elements of the liquid composition for an organic semiconductor device. As the high-molecular weight compounds, for example, high-molecular weight polystyrene, and high-molecular weight polymethyl methacrylate can be used. A polystyrene-equivalent weight average molecular weight of the high-molecular weight compounds is preferably not less than 500000, more preferably not less than 1000000. Further, a poor solvent can be also used as a viscosity increasing agent. That is, by adding a small amount of the poor solvent based on the solid content in the liquid composition for an organic semiconductor device, viscosity of the liquid composition for an organic semiconductor device can be increased. When a poor solvent is added for this purpose, a kind and an amount of the poor solvent added may be selected in such a range that the solid content in the liquid composition for an organic semiconductor device is not precipitated. From the viewpoint of stability at storage, an amount of the poor solvent is preferably not more than 50% by weight, more preferably not more than 30% by weight based on the total of the liquid composition for an organic semiconductor device.

The antioxidant which may be contained in the liquid composition for an organic semiconductor device may be any antioxidant which does not inhibit light emission and charge transportation. By using an antioxidant, storage stability of the liquid composition for an organic semiconductor device of the present invention can be improved.

Organic EL Device

Figure 1:
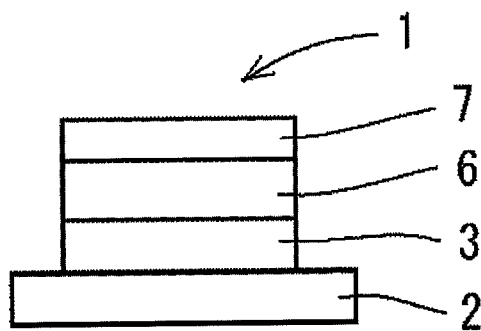
FIG. 1: A cross-sectional view schematically showing one embodiment of the structure of the organic EL device of the present invention.

Then, as an example of the organic semiconductor device of the present invention, an organic EL device will be described. FIG. 1 is a cross-sectional view schematically showing one embodiment of a constitution of the organic EL device of the present invention. This organic EL device 1 has, on a substrate 2, a first electrode 3, a second electrode 7, and an organic layer 6 provided between the first electrode and the second electrode.

By taking the organic EL device shown in FIG. 1 as an example, the step of forming the organic layer 6 will be described below, and the details of other constituent elements of the organic EL device 1 will be described later.

A thin film containing an organic compound in the organic layer 6 is formed by applying a liquid composition for an organic semiconductor device on the first electrode 3. As the liquid composition for an organic semiconductor device, the liquid composition which has been stored by the storing method of the present invention is used.

Examples of a method of applying the liquid composition for an organic semiconductor device include applying methods such as a spin coating method, a casting method, a microgravure coating method, a gravure coating method, a bar coating method, a roll coating method, a wire bar coating method, a dip coating method, a slit coating method, a capillary coating method, a spray coating method, and a nozzle coating method, as well as printing methods such as a gravure printing method, a screen printing method, a flexo printing method, an offset printing method, a reverse printing method, and an inkjet printing method. Printing methods such as a gravure printing method, a screen printing method, a flexo printing method, an offset printing method, a reverse printing method, and an inkjet printing method are preferable in that pattern formation and color-coding of multiple colors are easily performed.

It is preferable that the organic layer 6 is formed under an atmosphere containing an inert gas, and even under an atmospheric environment or under an atmosphere in which a concentration of the inert gas in the atmosphere is not less than a concentration of the inert gas contained in the atmospheric environment. Examples of the inert gas include helium gas, argon gas, and nitrogen gas. The organic layer 6 may be formed under an atmosphere in which these inert gases are mixed. Among these inert gases, nitrogen gas is preferable from the viewpoint of easiness in device manufacturing.

From the viewpoint of lifetime property, it is preferable that the organic layer 6 is formed under an atmosphere in which the oxygen concentration is not more than 1000 ppm as expressed by a volumetric ratio and/or the moisture concentration is not more than 1000 ppm as expressed by a volumetric ratio, and it is more preferable that the organic layer 6 is formed under an atmosphere in which the oxygen concentration is not more than 10 ppm as expressed by a volumetric ratio and/or the moisture concentration is not more than 10 ppm as expressed by a volumetric ratio.

Then, it is preferable that the organic layer 6 is baked in the state where the oxygen concentration and the moisture concentration in the atmosphere are retained at not more than 1000 ppm as expressed by a volumetric ratio, respectively. The baking of the organic layer 6 is usually performed subsequent to the step of forming the organic layer 6. By this baking, the solvent contained in the organic layer is removed.

It is preferable that baking is performed at a temperature in a range of from 50° C. to 250° C., from the viewpoint of the light emitting property and lifetime property of the organic EL device. A baking time is appropriately selected depending on the components of the organic compound contained in the organic layer 6, and is usually around from 5 minutes to 2 hours.

It is preferable that baking of the organic layer 6 is performed under an atmosphere containing an inert gas, from the viewpoint of increasing lifetime of the organic EL device. Examples of the inert gas include helium gas, argon gas and nitrogen gas. The organic layer 6 may be baked under an atmosphere in which these inert gases are mixed. Among these inert gases, nitrogen gas is preferable from the viewpoint of easiness in device manufacturing. These inert gases are introduced into an accommodation apparatus for accommodating an device precursor. A concentration of the inert gas in the atmosphere is usually not less than 99%, preferably not less than 99.5% as expressed by a volumetric ratio.

It is preferable that baking of the organic layer 6 is performed in the state where the oxygen concentration and the moisture concentration in the atmosphere are retained at not more than 600 ppm as expressed by a volumetric ratio, respectively, from the viewpoint of the light emitting property and lifetime property of the organic EL device, it is further preferable that the oxygen concentration and the moisture concentration are not more than 300 ppm as expressed by a volumetric ratio, respectively, it is more preferable that the oxygen concentration and the moisture concentration are not more than 100 ppm as expressed by a volumetric ratio, respectively, and it is particularly preferable that the oxygen concentration and the moisture concentration are not more than 10 ppm as expressed by a volumetric ratio, respectively.

In addition, it is preferable that baking of the organic layer 6 is performed under an atmosphere at not more than 10 Pa, from the viewpoint of increasing lifetime of the organic EL device. It is preferable that baking of the organic layer 6 is performed in an accommodation apparatus into which an inert gas is introduced and, at the same time, where pressure is reduced. When baking is performed under a pressure-reduced atmosphere, the solvent contained in the organic layer 6 can be removed more as compared with baking under the atmospheric pressure.

By forming the second electrode 7 on the organic layer 6 after formation of an organic film comprised in the organic layer 6, the organic EL device 1 is manufactured.

In a preferable embodiment of the present invention, the first electrode 3 is an anode, the second electrode 7 is a cathode, and the organic layer 6 is a light emitting layer in the organic EL device 1.

Figure 2:
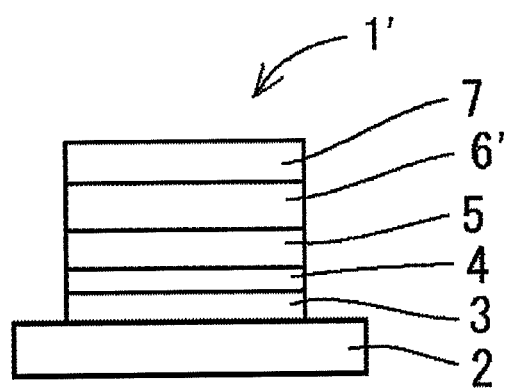
FIG. 2: A cross-sectional view schematically showing another embodiment of the structure of the organic EL device of the present invention.

FIG. 2 is a cross-sectional view schematically showing another embodiment of a constitution of the organic EL device of the present invention. This organic EL device 1' has, on a substrate 2, a first electrode 3, a second electrode 7, a first organic layer 4, a second organic layer 5 and a third organic layer 6' provided between the first electrode 3 and the second electrode 7.

In a preferable embodiment of the present invention, the first electrode 3 is an anode, and the second electrode 7 is a cathode in the organic EL device 1'. In this case, constitution of the organic layer is such that the third organic layer 6' next to the cathode is a light emitting layer. The first organic layer 4 is a hole injecting layer, and the second organic layer 5 is a hole transporting layer which are positioned between the third organic layer and the first electrode.

By taking the organic EL device shown in FIG. 2 as an example, the step of forming the organic layer will be described below, and the details of other constituent elements of the organic EL device will be described later.

The organic layer is formed by applying a liquid composition for an organic semiconductor device on the first electrode. As the liquid composition for an organic semiconductor device, the liquid composition which has been stored by the storing method of the present invention is used.

Formation of the organic layer by applying the liquid composition for an organic semiconductor device on the first electrode includes the case where the organic layer is formed on a surface of the first electrode, the case where the organic layer is formed on a surface of the hole injecting layer present above the first electrode, and the case where the organic layer is formed on a surface of the hole transporting layer present above the first electrode.

The step of forming the third organic layer 6' as a light emitting layer is performed in the same manner as in the step of forming the organic layer 6 in the organic EL device 1 described above.

The second organic layer 5 means a layer which is adjacent with the light emitting layer, is not usually involved in light emitting, and has the function of transporting charges (charge transporting layer).

By taking the second organic layer 5 as a hole transporting layer as an example, a method of forming the organic layer will be described below. In this case, the first organic layer 4 is a hole injecting layer.

First, the first electrode 3 and the first organic layer 4 are formed on the substrate 2. Thereafter, the liquid composition for an organic semiconductor device which has been stored by the storing method of the present invention is applied on the first organic layer 4 to form the second organic layer 5.

It is preferable that the hole transporting 5 is formed under the atmospheric pressure or under an atmosphere containing an inert gas, in that the organic EL device can be easily manufactured. Examples of the inert gas include helium gas, argon gas, and nitrogen gas. The hole transporting layer 5 may be baked under an atmosphere in which these inert gases are mixed. Among these inert gases, nitrogen gas is preferable from the viewpoint of easiness in device manufacturing.

The hole transporting layer 5 may be formed, for example, under an atmospheric environment, or under an atmosphere in which a concentration of the inert gas in the atmosphere is usually not less than 99% as expressed by a volumetric ratio. From the viewpoint of increasing device lifetime of the organic EL device, it is preferable that the hole transporting layer is formed under an atmosphere in which a concentration of the inert gas is not less than 99.5%.

From the viewpoint of easiness in device manufacturing, it is preferable that the hole transporting layer 5 is formed under an atmosphere in which the oxygen concentration is not more than 1000 ppm as expressed by a volumetric ratio and/or the moisture concentration is not more than 1000 ppm as expressed by a volumetric ratio, and it is further preferable that the hole transporting layer 5 is formed under an atmosphere in which the oxygen concentration is not more than 10 ppm as expressed by a volumetric ratio and/or the moisture concentration is not more than 10 ppm as expressed by a volumetric ratio.

Then, it is preferable that the hole transporting layer 5 is baked in the state where the oxygen concentration and the moisture concentration in the atmosphere are retained at not more than 1000 ppm as expressed by a volumetric ratio, respectively. By this baking, the solvent contained in the hole transporting layer 5 is removed.

It is preferable that baking is performed at a temperature in a range of from 50° C. to 250° C., from the viewpoint of the light emitting property and lifetime property of the organic EL device. A baking time is appropriately selected depending on the components of the organic compound contained in the hole transporting layer 5, and is usually from around 5 minutes to 2 hours.

It is preferable that baking of the hole transporting layer 5 is performed under an atmosphere containing an inert gas, from the viewpoint of increasing lifetime of the organic EL device. Examples of the inert gas include helium gas, argon gas, and nitrogen gas. The organic layer 6 may be baked under an atmosphere in which these inert gases are mixed. Among these inert gases, nitrogen gas is preferable from the viewpoint of easiness in device manufacturing. These inert gases are introduced into an accommodation apparatus for accommodating an device precursor. A concentration of the inert gas in the atmosphere is usually not less than 99%, preferably not less than 99.5% as expressed by a volumetric ratio.

It is preferable that baking of the hole transporting layer 5 is performed under an atmosphere at not more than 10 Pa, from the viewpoint of increasing lifetime of the organic EL device. It is preferable that baking of the hole transporting layer 5 is performed in an accommodation apparatus into which the inert gas is introduced and, at the same time, where pressure is reduced.

In addition, from the viewpoint of the light emitting property and lifetime property of the organic EL device, it is more preferable that formation of the hole transporting layer 5 and baking of the hole transporting layer are performed in the state where the oxygen concentration and the moisture concentration in the atmosphere are retained at not more than 600 ppm as expressed by a volumetric ratio, respectively, it is further preferable that the oxygen concentration and the moisture concentration are not more than 300 ppm as expressed by a volumetric ratio, respectively, it is more preferable that the oxygen concentration and the moisture concentration are not more than 100 ppm as expressed by a volumetric ratio, respectively, and it is particularly preferable that the oxygen concentration and the moisture concentration are not more than 10 ppm as expressed by a volumetric ratio, respectively.

By forming an organic film comprised in the light emitting layer 6 on the hole transporting layer 5 by the aforementioned method after formation of the hole transporting layer 5, and further forming the second cathode 7 thereon, the organic EL device 1' is manufactured.

Device constitutions of the organic EL device, and each constituent element will be described in more detail below.

The organic EL device of the present invention has a first electrode, a second electrode, and a light emitting layer arranged between the first electrode and the second electrode, as essential constituent features. In addition, a functional layer in addition to the organic layer is provided between the first electrode (e.g. anode) and the second electrode (e.g. cathode), for example, for improving device properties, in some cases.

Examples of the functional layer provided between the cathode and the light emitting layer include an electron injecting layer, an electron transporting layer, and a hole blocking layer. In addition, when both layers of the electron injecting layer and the electron transporting layer are provided between the cathode and the light emitting layer, the layer in contact with the cathode is referred to as an electron injecting layer, and layers except for this electron injecting layer are referred to as electron transporting layers, in some cases.

The electron injecting layer is a layer having the function of improving an efficiency of electron injection from the cathode. The electron transporting layer is a layer having the function of improving electron injection from the cathode, the electron injecting layer or the electron transporting layer closer to the cathode. The hole blocking layer is a layer having the function of blocking transportation of holes. In addition, when the electron injecting layer, and/or the electron transporting layer have the function of blocking transportation of holes, these layers also serve as the hole blocking layer, in some cases.

It can be confirmed, for example, by manufacturing an device which flows only a hole current that the hole blocking layer has the function of blocking transportation of holes. For example, an device which is not provided with the hole blocking layer, and flows only a hole current, and an device having a constitution that the hole blocking layer is inserted into the above device are manufactured, and it can be confirmed by decrease in a current value of the device provided with the hole blocking layer that the hole blocking layer exhibits the function of blocking transportation of holes.

Examples of a layer provided between the anode and the light emitting layer include a hole injecting layer, a hole transporting layer and an electron blocking layer. When both layers of the hole injecting layer and the hole transporting layer are provided between the anode and the light emitting layer, the layer in contact with the anode is referred to as a hole injecting layer, and layers except for this hole injecting layer are referred to as hole transporting layers, in some cases.

The hole injecting layer is a layer having the function of improving an efficiency of hole injection from the anode. The hole transporting layer is a layer having the function of improving hole injection from the anode, the hole injecting layer, or the hole transporting layer closer to the anode. The electron blocking layer is a layer having the function of blocking transportation of electrons. In addition, when the hole injecting layer, and/or the hole transporting layer have the function of blocking transportation of electrons, these layers also serve as the electron blocking layer, in some cases.

It can be confirmed, for example, by manufacturing an device which flows only an electron current that the electron blocking layer has the function of blocking transportation of electrons. For example, an device which is not provided with the electron blocking layer, and flows only an electron current, and an device having a constitution that the electron blocking layer is inserted into the above device are manufactured, and it can be confirmed by decease in a current value of the device provided with the electron blocking layer that the electron blocking layer exhibits the function of blocking transportation of electrons.

One example of the device constitutions which can be taken by the organic EL device of the present embodiment will be shown below.

a) Anode/hole injecting layer/light emitting layer/cathode
b) Anode/hole injecting layer/light emitting layer/electron injecting layer/cathode
c) Anode/hole injecting layer/light emitting layer/electron transporting layer/cathode
e) Anode/hole injecting layer/light emitting layer/electron transporting layer/electron injecting layer/cathode
f) Anode/hole transporting layer/light emitting layer/cathode
d) Anode/hole transporting layer/light emitting layer/electron injecting layer/cathode
e) Anode/hole transporting layer/light emitting layer/electron transporting layer/cathode
f) Anode/hole transporting layer/light emitting layer/electron transporting layer/electron injecting layer/cathode
g) Anode/hole injecting layer/hole transporting layer/light emitting layer/cathode
h) Anode/hole injecting layer/hole transporting layer/light emitting layer/electron injecting layer/cathode
i) Anode/hole injecting layer/hole transporting layer/light emitting layer/electron transporting layer/cathode
j) Anode/hole injecting layer/hole transporting layer/light emitting layer/electron transporting layer/electron injecting layer/cathode
k) Anode/light emitting layer/electron injecting layer/anode
l) Anode/light emitting layer/electron transporting layer/cathode
m) Anode/light emitting layer/electron transporting layer/electron injecting layer/cathode
(wherein, a symbol "/" indicates that respective layers holding the symbol "/" are laminated as being adjacent with each other. The same shall apply hereinafter.)

The organic EL device may have two or more layers of light emitting layers. When layers provided between the anode and the cathode are defined as "repeating unit A", respectively, in each constitution shown in a) to m), an example of an organic EL device having two layers of light emitting layers includes an device constitution shown in the following n).

n) Anode/(repeating unit A)/charge generating layer/(repeating unit A)/cathode

In addition, when "(repeating unit A)/charge generating layer" is defined as "repeating unit B", a specific example of an organic EL device having three or more layers of light emitting layers includes an device constitution shown in the following o).

o) Anode/(repeating unit B)x/(repeating unit A)/cathode

Wherein, a symbol "x" represents an integer of not less than 2, and "(repeating unit B)x" represents a constitution in which (repeating unit B)s are laminated in the number of "x". The charge generating layer is a layer in which holes and electrons are generated by applying the electric filed. Examples of the charge generating layer include thin films including vanadium oxide, indium tin oxide (abbreviation ITO), molybdenum oxide etc.

The organic EL device may be further covered with a sealing member such as a sealing film or a sealing plate for sealing. When the organic EL device is provided on a substrate, an anode is usually arranged on a substrate side, but a cathode may be arranged on a substrate side.

In the organic EL device of the present embodiment, in order to take out light generated in the interior, usually, all layers arranged on a side of taking out light based on the light emitting layer are made to be transparent. It is preferable that an extent of transparency is such that a visible light transmittance between the most outer surface of the organic EL device on a side of taking out light, and the light emitting layer is not less than 40%. In the case of the organic EL device which is required to emit light in an ultraviolet region or an infrared region, it is preferable that a light transmittance of not less than 40% in the region is exhibited.

In the organic EL device of the present embodiment, an insulating layer having a film thickness of not more than 2 nm may be further provided adjacent with the electrode, in order to improve adherability with the electrode and to improve property of charge injection from the electrode. In addition, in order to improve adherability at an interface and prevent mixing, a thin buffer layer may be inserted between the aforementioned respective layers.

An order and the layer number of layers to be laminated, and a thickness of each layer can be appropriately set in view of light emitting efficiency and device lifetime.

Then, a material of, and a method of forming each layer constituting the organic EL device will be more specifically described.

<Substrate>

As the substrate, a substrate which does not change in the step of manufacturing the organic EL device is preferably used and, for example, a glass, a plastic, a high-molecular film, and a silicon substrate, as well as a laminate thereof are used. As the substrate, a commercially available substrate can be used, and the substrate can be manufactured by a known method.

<Anode>

As the anode, in the case of an organic EL device having a constitution that light from the light emitting layer is taken out through the anode, a transparent or translucent electrode is used. As the transparent electrode or the translucent electrode, a thin film of metal oxide, metal sulfide and a metal having high electric conductivity can be used, and a thin film having high light transmittance is preferably used. Specifically, thin films composed of indium oxide, zinc oxide, tin oxide, ITO, indium zinc oxide (abbreviation IZO), gold, platinum, silver, and copper are used and, among them, thin films composed of ITO, IZO, or tin oxide are preferably used. Examples of a method of manufacturing the anode include a vacuum deposition method, a sputtering method, an ion plating method, and a plating method. Further, as the anode, an organic transparent electrically conductive film of polyaniline or a derivative thereof, or polythiophene or a derivative thereof may be used.

In the anode, a material which reflects light may be used and, as the material, a metal, metal oxide and metal sulfide having a work function of not less than 3.0 eV are preferable.

A film thickness of the anode can be appropriately selected in view of permeability of light and electric conductivity, and is, for example, from 10 nm to 10 μm, preferably from 20 nm to 1 μm, more preferably from 50 nm to 500 nm.

<Hole Injecting Layer>

Examples of a hole injecting material constituting the hole injecting layer include oxides such as vanadium oxide, molybdenum oxide, ruthenium oxide and aluminum oxide, as well as phenylamine-based compounds, star burst-type amine-based compounds, phthalocyanine-based compounds, amorphous carbon, polyaniline, and polythiophene derivatives.

Examples of a method of forming a film of the hole injecting layer include film formation from a solution containing the hole injecting material. A solvent used in film formation from the solution is not particularly limited as far as it dissolves the hole injecting material, and the aforementioned organic solvents etc. may be used.

Examples of a method of forming a film from the solution include applying methods such as a spin coating method, a casting method, a nozzle coating method, a microgravure coating method, a gravure coating method, a bar coating method, a roll coating method, a wire bar coating method, a dip coating method, a spray coating method, a screen printing method, a flexo printing method, an offset printing method and an inkjet printing method.

A film thickness of the hole injecting layer is different in an optimal value depending on a material used, can appropriately be set so that a driving voltage and a light emitting efficiency become an adequate value, and is necessary a thickness such that at least a pinhole is not generated and, when the film thickness is too large, since the driving voltage of a device becomes higher, and thus this is not preferable.

Therefore, the film thickness of the hole injecting layer is, for example, from 1 nm to 1 μm, preferably from 2 nm to 500 nm, more preferably 5 nm to 200 nm.

<Hole Transporting Layer>

Examples of a hole transporting material constituting the hole transporting layer include polyvinyl carbazole or a derivative thereof, polysilane or a derivative thereof, a polysiloxane derivative having aromatic amine on a side chain or the main chain, a pyrazoline derivative, an arylamine derivative, a stilbene derivative, a triphenyldiamine derivative, polyaniline or a derivative thereof, polythiophene or a derivative thereof, polyarylamine or a derivative thereof, polypyrrole or a derivative thereof, poly(p-phenylenevinylene) or a derivative thereof, or poly(2,5-thienylenevinylene) or a derivative thereof.

Among them, as the hole transporting material, high-molecular hole transporting materials such as polyvinyl carbazole or a derivative thereof, polysilane or a derivative thereof, a polysiloxane derivative having an aromatic amine residue on a side chain or the main chain, polyaniline or a derivative thereof, polythiophene or a derivative thereof, polyarylamine or a derivative thereof, poly(p-phenylenevinylene) or a derivative thereof, or poly(2,5-thienylenevinylene) or a derivative thereof, a polyfluorene derivative, and a high-molecular compound having an aromatic amine residue are preferable, and further preferred are polyvinyl carbazole or a derivative thereof, a polyfluorene derivative, and a high-molecular compound having an aromatic amine residue. In the case of a low-molecular hole transporting material, it is preferable to use the material by dispersing it in a high-molecular binder.

Examples of a method of forming a film of the hole transporting layer are not particularly limited, and in the case of the low-molecular hole transporting material, include film formation from a mixed solution containing the high-molecular binder and the hole transporting material and, in the case of the high-molecular hole transporting material, include film formation from a solution containing the hole transporting material.

A solvent used in forming a film from the solution is not particularly limited as far as it dissolves the hole transporting material, and the aforementioned organic solvents etc. may be used.

Examples of a method of forming a film from the solution include the same applying method as the aforementioned method of forming a film of the hole injecting layer and, from the viewpoint of increasing lifetime, it is preferable that a film is formed under the same atmosphere as that of the step of forming an organic layer.

As the high-molecular binder to be mixed, one which does not extremely inhibit charge transportation is preferable, and one which is weak in absorption of visible light is preferably used, and examples thereof include polycarbonate, polylacrylate, polymethyl acrylate, polymethyl methacrylate, polystyrene, polyvinyl chloride, and polysiloxane.

A film thickness of the hole transporting layer is different in an optimal value depending on a material used, can appropriately be set so that a driving voltage and a light emitting efficiency become an adequate value, and is necessary a thickness such that at least a pinhole is not generated and, when the film thickness is too large, since the driving voltage of a device becomes higher, and thus this is not preferable. Therefore, the film thickness of the hole transporting layer is, for example, from 1 nm to 1 μm, preferably from 2 nm to 500 nm, more preferably from 5 nm to 200 nm.

<Light Emitting Layer>

Examples of a material contained in the light emitting layer include the aforementioned light emitting materials. The light emitting layer may contain a composition of the light emitting material and the dopant.

In addition, a thickness of the light emitting layer is usually from about 2 nm to 200 nm.

A film of the light emitting layer is formed by film formation from the liquid composition for an organic semiconductor device, film formation from a solution containing the light emitting material etc., as described above. Examples of a solvent contained in the solution include the aforementioned organic solvents.

Examples of a method of applying the solution containing the light emitting material include applying methods such as a spin coating method, a casting method, a microgravure coating method, a gravure coating method, a bar coating method, a roll coating method, a wire bar coating method, a dip coating method, a slit coating method, a capillary coating method, a spray coating method and a nozzle coating method as well as printing methods such as a gravure printing method, a screen printing method, a flexo printing method, an offset printing method, a reverse printing method, and an inkjet printing method. Printing methods such as a gravure printing method, a screen printing method, a flexo printing method, an offset printing method, a reverse printing method, and an inkjet printing method are preferable in that pattern formation and color-coding of multiple colors are easily performed.

<Electron Transporting Layer>

As an electron transporting material constituting the electron transporting layer, known electron transporting materials can be used, and examples thereof include an oxadiazole derivative, anthraquinodimethane or a derivative thereof, benzoquinone or a derivative thereof, naphthoquinone or a derivative thereof, anthraquinone or a derivative thereof, tetracyanoanthraquinodimethane or a derivative thereof, a fluorenone derivative, diphenyldicyanoethylene or a derivative thereof, a diphenoquinone derivative, or a metal complex of 8-hydroxyquinoline or a derivative thereof, polyquinoline or a derivative thereof, polyquinoxaline or a derivative thereof, and polyfluorene or a derivative thereof.

Among them, as the electron transporting material, an oxadiazole derivative, benzoquinone or a derivative thereof, anthraquinone or a derivative thereof, or a metal complex of 8-hydroxyquinoline or a derivative thereof, polyquinoline or a derivative thereof, polyquinoxaline or a derivative thereof, and polyfluorene or a derivative thereof are preferable, and 2-(4-biphenylyl)-5-(4-tert-butylphenyl)-1,3,4-oxadiazole, benzoquinone, anthraquinone, tris(8-quinolinol)aluminum, and polyquinoline are further preferable.

A method of forming a film of the electron transporting layer is not particularly limited, but in the case of a low-molecular electron transporting material, examples thereof include a method of vacuum deposition from a powder, or film formation from a solution or molten state and, in the case of a high-molecular electron transporting material, examples thereof include film formation from a solution or molten state. In addition, in the case of film formation from a solution or the molten state, a high-molecular binder may be used in combination. Examples of a method of forming a film of the electron transporting layer from a solution include the same method of forming a film as the method of forming a film of the hole transporting layer from a solution, and it is preferable that the film is formed under the same atmosphere as that of the step of forming an adjacent layer.

A film thickness of the electron transporting layer is different in an optimal value depending on a material used, can appropriately be set so that a driving voltage and a light emitting efficiency become an adequate value, and is necessary a thickness such that at least a pinhole is not generated is necessary and, when the film thickness is too large, since the driving voltage of a device becomes higher, and thus this is not preferable. Therefore, the film thickness of the electron transporting layer is, for example, from 1 nm to 1 μm, preferably from 2 nm to 500 nm, more preferably from 5 nm to 200 nm.

<Electron Injecting Layer>

As a material constituting the electron injecting layer, an optimal material is appropriately selected depending on a kind of the light emitting layer, and examples thereof include an alkali metal, an alkaline earth metal, an alloy containing one or more kinds of an alkali metal and an alkaline earth metal, an oxide, halide, and carbonate of an alkali metal or of an alkaline earth metal, or a mixture of these metals. Examples of the alkali metal, and the oxide, halide and carbonate of the alkali metal include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. In addition, examples of the alkaline earth metal, and the oxide, halide and carbonate of the alkaline earth metal include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injecting layer may be constituted with a laminate in which two or more layers are layered, and examples thereof include an electrode in which lithium fluoride and calcium are layered (LiF/Ca). The electron injecting layer is formed by a deposition method, a sputtering method, or a printing method.

As a film thickness of the electron injecting layer, it is preferable from around 1 nm to 1 μm.

<Cathode>

As a material of the cathode, materials which have a small work function, easily inject electrons into the light emitting layer, and have high electrical conductivity are preferable. In addition, in an organic EL device in which light is taken out from an anode side, materials having high visible light reflectivity are preferable as a material of the cathode since light from the light emitting layer is reflected with the cathode to an anode side. In the cathode, for example, an alkali metal, an alkaline earth metal, a transition metal and a Group III-B metal can be used. As the material of the cathode, for example, metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, alloys of two or more kinds of the metals, alloys of one or more kinds of the metals and one or more kinds of gold, silver, platinum, copper, manganese, titanium, cobalt, nickel, tungsten, and tin, or graphite or a graphite intercalation compound are used. Examples of the alloys include a magnesium-silver alloy, a magnesium-indium alloy, a magnesium-aluminum alloy, an indium-silver alloy, a lithium-aluminum alloy, a lithium-magnesium-alloy, a lithium-indium alloy, and a calcium-aluminum alloy. In addition, as the cathode, a transparent electrically conductive electrode composed of an electrically conductive metal oxide and an electrically conductive organic substance can be used. Specifically, examples of the electrically conductive metal oxide include indium oxide, zinc oxide, tin oxide, ITO, and IZO, and examples of the electrically conductive organic substance include polyaniline or a derivative thereof, polythiophene or a derivative thereof. In addition, the cathode may be constituted with a laminate in which two or more layers are layered. In addition, the electron injecting layer is used as the cathode, in some cases.

A film thickness of the cathode can appropriately be set in view of electrical conductivity and durability, and is, for example, from 10 nm to 10 μm, preferably from 20 nm to 1 μm, more preferably from 50 nm to 500 nm.

Examples of a method of manufacturing the cathode include a vacuum deposition method, a sputtering method, and a lamination method of thermally pressing a metal thin film.

<Insulating Layer>

Examples of a material of the insulating layer include metal fluoride, metal oxide, and an organic insulating material. Examples of an organic EL device in which an insulating layer having a film thickness of not more than 2 nm is provided include one in which an insulating layer having a film thickness of not more than 2 nm is provided adjacent with the cathode, and one in which an insulating layer having a film thickness of not more than 2 nm is provided adjacent with the anode.

The above-described organic EL device can be preferably used in curved or planar illumination apparatuses, for example, a planar light source used as a light source of a scanner, and a display apparatus.

Examples of the display apparatus provided with the organic EL device include an active matrix display apparatus, a passive matrix display apparatus, a segment display apparatus, a dot matrix display apparatus and a liquid crystal display apparatus. The organic EL device is used as a light emitting device constituting each pixel in the active matrix display apparatus and the passive matrix display apparatus, is used as a light emitting device constituting each segment in the segment display apparatus, and is used as a backlight in the dot matrix display apparatus and the liquid crystal display apparatus.

EXAMPLES

The present invention will be described in more detail below by way of examples, but is not limited to the following examples.

Reference Example 1

Manufacture of Organic EL Device Using Liquid Composition for Organic Semiconductor Device 1

As an organic solvent, xylene was added to a green light emitting high-molecular material 1 so that a concentration of the green light emitting high-molecular material 1 became 1.4% by weight, and it was dissolved at room temperature under an atmospheric environment to prepare a liquid composition for an organic semiconductor device 1.

Without storing the resulting liquid composition for an organic semiconductor device 1, an organic EL device having the following constitution was manufactured using the liquid composition for an organic semiconductor device 1.

"Glass substrate/ITO (150 nm)/Baytron P (65 nm)/high-molecular compound 1 (20 nm)/green light emitting high-molecular material 1 (100 nm)/Ba (5 nm)/Al (80 nm)"

A suspension of poly(3,4)ethylenedioxythiophene/polystyrene sulfonic acid (manufactured by Starck; Baytorn P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes to obtain a hole injecting layer. In addition, in formation of the hole injecting layer, the step of forming a thin film and the step of baking the thin film were preformed under an atmospheric environment.

Then, a high-molecular compound 1 which is a hole transporting material was dissolved in xylene to prepare a xylene solution 1. A concentration of the high-molecular compound 1 in this xylene solution 1 was made to be 0.8% by weight. Then, under an atmospheric environment, the xylene solution 1 was applied on the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the liquid composition for an organic semiconductor device 1 which had not been stored was applied on the hole transporting layer by a spin coating method under an atmospheric environment, to form a thin film for a light emitting layer having a film thickness of 100 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 31.0 cd/A. In addition, when the device was driven at a constant current at an initial luminance of 8,000 cd/m$^2$, a time during which the luminance became 50% of the initial luminance (luminance half life) was 120 hours.

Example 1

Storage of Liquid Composition for Organic Semiconductor Device 1

As an organic solvent, xylene was added to a green light emitting high-molecular material 1 so that a concentration of the green light emitting high-molecular material 1 became 1.4% by weight, and it was dissolved at room temperature under an atmospheric environment to prepare a liquid composition for an organic semiconductor device 2.

The resulting liquid composition for an organic semiconductor device 2 was placed in a brown glass bottle, an opening part of the brown glass bottle was covered with a packing in which a surface of a nitrile rubber was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Light having a wavelength of not more than 500 nm was shielded, and the liquid composition was stored under a room temperature (23° C.) environment for 2 weeks.

Example 2

Manufacture of Organic EL Device Using Stored Liquid Composition for Organic Semiconductor Device 2

An organic EL device having the following constitution was manufactured using the liquid composition for an organic semiconductor device 2 after storage.
"Glass substrate/ITO (150 nm)/Baytron P (65 nm)/high-molecular compound 1 (20 nm)/green light emitting high-molecular material 1 (100 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to prepare a xylene solution 1. A concentration of the high-molecular compound 1 in this xylene solution 1 was made to be 0.8% by weight. Then under an atmospheric environment, the xylene solution 1 was applied on the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 2 was coated on the hole transporting layer by a spin coating method under an atmospheric environment, to form a thin film for a light emitting layer having a film thickness of 100 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 25.4 cd/A. In addition, when the device was driven at a constant current at an initial luminance of 8,000 cd/m$^2$, a time during which the luminance became 50% of the initial luminance (luminance half life) was 137 hours.

Comparative Example 1

Storage of Liquid Composition for Organic Semiconductor device 3

As an organic solvent, xylene was added to a green light emitting high-molecular material 1 so that a concentration of the green light emitting high-molecular material 1 became 1.4% by weight, and it was dissolved at room temperature under an atmospheric environment to prepare a liquid composition for an organic semiconductor device 3.

The resulting liquid composition for an organic semiconductor device 3 was placed in a brown glass bottle, an opening part of the brown glass bottle was covered with a packing in which a surface of polyethylene was coated with polypropylene, and a lid made of polypropylene was closed to seal the brown glass bottle. The atmosphere in the container was the air. Light having a wavelength of not more than 500 nm was shielded, and the liquid composition was stored under a room temperature (23° C.) environment for 2 weeks.

Comparative Example 2

Manufacture of Organic EL Device Using Stored Liquid Composition for Organic Semiconductor Device 3

An organic EL device having the following constitution was manufactured using the liquid composition for an organic semiconductor device 3 after storage.

"Glass substrate/ITO (150 nm)/Baytron P (65 nm)/high-molecular compound 1 (20 nm)/green light emitting high-molecular material 1 (100 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to prepare a xylene solution 1. A concentration of the high-molecular compound 1 in this xylene solution 1 was made to be 0.8% by weight. Then under an atmospheric environment, the xylene solution 1 was applied on the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 3 was applied on the hole transporting layer by a spin coating method under an atmospheric environment, to form a thin film for a light emitting layer having a film thickness of 100 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 30.0 cd/A. In addition, when the device was driven at a constant current at an initial luminance of 8,000 cd/m$^2$, a time during which the luminance became 50% of the initial luminance (luminance half life) was 80 hours.

Example 3

Storage of Liquid Composition for Organic Semiconductor Device 4

As an organic solvent, xylene was added to a green light emitting high-molecular material 1 so that a concentration of the green light emitting high-molecular material 1 became 1.4% by weight, and it was dissolved at room temperature under an atmospheric environment to prepare a liquid composition for an organic semiconductor device 4.

The resulting liquid composition for an organic semiconductor device 4 was placed in a brown glass bottle, an opening part of the brown glass bottle was covered with a packing in which a surface of a nitrile rubber was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Light having a wavelength of not more than 500 nm was shielded, and the liquid composition was stored under a room temperature (23° C.) environment for 18 hours in the state that the liquid composition for an organic semiconductor device 4 was in contact with the packing.

Example 4

Manufacture of Organic EL Device Using Stored Liquid Composition for Organic Semiconductor Device 4

An organic EL device having the following constitution was manufactured using the liquid composition for an organic semiconductor device 4 after storage.

"Glass substrate/ITO (150 nm)/Baytron P (65 nm)/high-molecular compound 1 (20 nm)/green light emitting high-molecular material 1 (100 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to prepare a xylene solution 1. A concentration of the high-molecular compound 1 in this xylene solution 1 was made to be 0.8% by weight. Then under an atmospheric environment, the xylene solution 1 was applied on the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 4 was applied on the hole transporting layer by a spin coating method under an atmospheric environment, to form a thin film for a light emitting layer having a film thickness of 100 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 30.1 cd/A. In addition, when the device was driven at a constant current at an initial luminance of 8,000 cd/m$^2$, a time during which the luminance became 50% of the initial luminance (luminance half life) was 121 hours.

Example 5

Storage of Liquid composition for Organic Semiconductor Device 5

As an organic solvent, xylene was added to a green light emitting high-molecular material 1 so that a concentration of the green light emitting high-molecular material 1 became 1.4% by weight, and it was dissolved at room temperature under an atmospheric environment to prepare a liquid composition for an organic semiconductor device 5.

The resulting liquid composition for an organic semiconductor device 5 was placed in a brown glass bottle, an opening part of the brown glass bottle was covered with a packing in which a surface of polyethylene was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Light having a wavelength of not more than 500 nm was shielded, and the liquid composition was stored under a room temperature (23° C.) environment for 18 hours in the state that the liquid composition for an organic semiconductor device 5 was in contact with the packing.

Example 6

Manufacture of Organic EL Device Using Stored Liquid Composition for Organic Semiconductor Device 5

An organic EL device having the following constitution was manufactured using the liquid composition for an organic semiconductor device 5 after storage.
"Glass substrate/ITO (150 nm)/Baytron P (65 nm)/high-molecular compound 1 (20 nm)/green light emitting high-molecular material 1 (100 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to prepare a xylene solution 1. A concentration of the high-molecular compound 1 in this xylene solution 1 was made to be 0.8% by weight. Then under an atmospheric environment, the xylene solution 1 was applied on the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 5 was applied on the hole transporting layer by a spin coating method under an atmospheric environment, to form a thin film for a light emitting layer having a film thickness of 100 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 30.3 cd/A. In addition, when the device was driven at a constant current at an initial luminance of 8,000 cd/m$^2$, a time during which the luminance became 50% of the initial luminance (luminance half life) was 123 hours.

Comparative Example 3

Storage of Liquid Composition for Organic Semiconductor Device 6

As an organic solvent, xylene was added to a green light emitting high-molecular material 1 so that a concentration of the green light emitting high-molecular material 1 became 1.4% by weight, and it was dissolved at room temperature under an atmospheric environment to prepare a liquid composition for an organic semiconductor device 6.

The resulting liquid composition for an organic semiconductor device 6 was placed in a brown glass bottle, an opening part of the brown glass bottle was covered with a packing in which a surface of polyethylene was coated with polypropylene, and a lid made of polypropylene was closed to seal the brown glass bottle. The atmosphere in the container was the air.

Light having a wavelength of not more than 500 nm was shielded, and the liquid composition was stored under a room temperature (23° C.) environment for 18 hours in the state that the liquid composition for an organic semiconductor device 6 was in contact with the packing.

Comparative Example 4

Manufacture of Organic EL Device Using Stored Liquid Composition for Organic Semiconductor Device 6

An organic EL device having the following constitution was manufactured using the liquid composition for an organic semiconductor device 6 after storage.

"Glass substrate/ITO (150 nm)/Baytron P (65 nm)/high-molecular compound 1 (20 nm)/green light emitting high-molecular material 1 (100 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to prepare a xylene solution 1. A concentration of the high-molecular compound 1 in this xylene solution 1 was made to be 0.8% by weight. Then under an atmospheric environment, the xylene solution 1 was applied on the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 6 was applied on the hole transporting layer by a spin coating method under an atmospheric environment, to form a thin film for a light emitting layer having a film thickness of 100 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 30.0 cd/A. In addition, when the device was driven at a constant current at an initial luminance of 8,000 cd/m$^2$, a time during which the luminance became 50% of the initial luminance (luminance half life) was 25 hours.

Comparative Example 5

Storage of Liquid Composition for Organic Semiconductor Device 7

As an organic solvent, xylene was added to a green light emitting high-molecular material 1 so that a concentration of the green light emitting high-molecular material 1 became 1.4% by weight, and it was dissolved at room temperature under an atmospheric environment to prepare a liquid composition for an organic semiconductor device 7.

The resulting liquid composition for an organic semiconductor device 7 was placed in a brown glass bottle, an opening part of the brown glass bottle was covered with a packing in which a surface of heat resistant polyethylene was coated with polypropylene (manufactured by Maruemu Corporation, GEAR PACKING (HRPP high sheet), Type No. 02), and a lid made of polypropylene was closed to seal the brown glass bottle. The atmosphere in the container was the air. Light having a wavelength of not more than 500 nm was shielded, and the liquid composition was stored under a room temperature (23° C.) environment for 18 hours in the state that the liquid composition for an organic semiconductor device 7 was in contact with the packing.

Comparative Example 6

Manufacture of Organic EL Device Using Stored Liquid Composition for Organic Semiconductor Device 7

An organic EL device having the following constitution was manufactured using the liquid composition for an organic semiconductor device 7 after storage.

"Glass substrate/ITO (150 nm)/Baytron P (65 nm)/high-molecular compound 1 (20 nm)/green light emitting high-molecular material 1 (100 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to prepare a xylene solution 1. A concentration of the high-molecular compound 1 in this xylene solution 1 was made to be 0.8% by weight. Then under an atmospheric environment, the xylene solution 1 was applied on the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 7 was applied on the hole transporting layer by a spin coating method under an atmospheric environment, to form a thin film for a light emitting layer having a film thickness of 100 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 30.9 cd/A. In addition, when the device was driven at a constant current at an initial luminance of 8,000 cd/m$^2$, a time during which the luminance became 50% of the initial luminance (luminance half life) was 91 hours.

Comparative Example 7

Storage of Liquid Composition for Organic Semiconductor Device 8

As an organic solvent, xylene was added to a green light emitting high-molecular material 1 so that a concentration of the green light emitting high-molecular material 1 became 1.4% by weight, and it was dissolved at room temperature under an atmospheric environment to prepare a liquid composition for an organic semiconductor device 8.

The resulting liquid composition for an organic semiconductor device 8 was placed in a brown glass bottle, an opening part of the brown glass bottle was covered with a packing made of a silicone rubber, and a lid made of polypropylene was closed to seal the brown glass bottle. The atmosphere in the container was the air. Light having a wavelength of not more than 500 nm was shielded, and the liquid composition was stored under a room temperature (23° C.) environment for 18 hours in the state that the liquid composition for an organic semiconductor device 8 was in contact with the packing.

Comparative Example 8

Manufacture of Organic EL Device Using Stored Liquid Composition for Organic Semiconductor Device 8

An organic EL device having the following constitution was manufactured using the liquid composition for an organic semiconductor device 8 after storage.
"Glass substrate/ITO (150 nm)/Baytron P (65 nm)/high-molecular compound 1 (20 nm)/green light emitting high-molecular material 1 (100 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to prepare a xylene solution 1. A concentration of the high-molecular compound 1 in this xylene solution 1 was made to be 0.8% by weight. Then under an atmospheric environment, the xylene solution 1 was applied on the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 8 was applied on the hole transporting layer by a spin coating method under an atmospheric environment, to form a thin film for a light emitting layer having a film thickness of 100 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

When a voltage was applied to the manufactured organic EL device up to 12V, a light emitting luminance was less than 10 cd/m$^2$, and light was not emitted at a luminance of 8,000 cd/m$^2$.

Reference Example 2

Storage of Liquid Composition for Organic Semiconductor Device 9

As an organic solvent, xylene was added to a green light emitting high-molecular material 2 so that a concentration of the green light emitting high-molecular material 2 became 1.4% by weight, and it was dissolved at room temperature under an atmospheric environment to prepare a liquid composition for an organic semiconductor device 9.

Without storing the resulting liquid composition for an organic semiconductor device 9, an organic EL device having the following constitution was manufactured using the liquid composition for an organic semiconductor device 9.
"Glass substrate/ITO (150 nm)/Baytron P (65 nm)/high-molecular compound 1 (20 nm)/green light emitting high-molecular material 2 (100 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to prepare a xylene solution 1. A concentration of the high-molecular compound 1 in this xylene solution 1 was made to be 0.8% by weight. Then under an atmospheric environment, the xylene solution 1 was applied on the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the liquid composition for an organic semiconductor device 9 without storing was applied on the hole transporting layer by a spin coating method under an atmospheric environment, to form a thin film for a light emitting layer having a film thickness of 80 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 10.8 cd/A. In addition, when the device was driven at a constant current at an initial luminance of 12,000 cd/m², a time during which the luminance became 50% of the initial luminance (luminance half life) was 215 hours.

Example 7

Storage of Liquid Composition for Organic Semiconductor Device 10

As an organic solvent, xylene was added to a green light emitting high-molecular material 2 so that a concentration of the green light emitting high-molecular material 2 became 1.4% by weight, and it was dissolved at room temperature under an atmospheric environment to prepare a liquid composition for an organic semiconductor device 10.

The resulting liquid composition for an organic semiconductor device 10 was placed in a brown glass bottle, an opening part of the brown glass bottle was covered with a packing in which a surface of a nitrile rubber was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Light having a wavelength of not more than 500 nm was shielded, and the liquid composition was stored under a room temperature (23° C.) environment for 18 hours in the state that the liquid composition for an organic semiconductor device was in contact with the packing.

Example 8

Manufacture of Organic EL Device Using Stored Liquid Composition for Organic Semiconductor Device 10

An organic EL device having the following constitution was manufactured using the liquid composition for an organic semiconductor device 10 after storage.

"Glass substrate/ITO (150 nm)/Baytron P (65 nm)/high-molecular compound 1 (20 nm)/green light emitting high-molecular material 2 (80 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to prepare a xylene solution 1. A concentration of the high-molecular compound 1 in this xylene solution 1 was made to be 0.8% by weight. Then under an atmospheric environment, the xylene solution 1 was applied on the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 10 was applied on the hole transporting layer by a spin coating method under an atmospheric environment, to form a thin film for a light emitting layer having a film thickness of 80 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 10.5 cd/A. In addition, when the device was driven at a constant current at an initial luminance of 12,000 cd/m², a time during which the luminance became 50% of the initial luminance (luminance half life) was 210 hours.

Comparative Example 9

Storage of Liquid Composition for Organic Semiconductor Device 11

As an organic solvent, xylene was added to a green light emitting high-molecular material 2 so that a concentration of the green light emitting high-molecular material 2 became 1.4% by weight, and it was dissolved at room temperature under an atmospheric environment to prepare a liquid composition for an organic semiconductor device 11.

The resulting liquid composition for an organic semiconductor device 11 was placed in a brown glass bottle, an opening part of the brown glass bottle was covered with a packing in which a surface of heat resistant polyethylene was coated with polypropylene (manufactured by Maruemu Corporation, GEAR PACKING (HRPP high sheet), Type No. 02), and a lid made of polypropylene was closed to seal the brown glass bottle. The atmosphere in the container was the air. Light having a wavelength of not more than 500 nm was shielded, and the liquid composition was stored under a room temperature (23° C.) environment for 18 hours in the state that the liquid composition for an organic semiconductor device 11 was in contact with the packing.

Comparative Example 10

Manufacture of Organic EL Device Using Stored Liquid Composition for Organic Semiconductor Device 11

An organic EL device having the following constitution was manufactured using the liquid composition for an organic semiconductor device 11 after storage.

"Glass substrate/ITO (150 nm)/Baytron P (65 nm)/high-molecular compound 1 (20 nm)/green light emitting high-molecular material 2 (80 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, a high-molecular compound 1 which is a hole transporting material was dissolved in xylene to prepare a xylene solution 1. A concentration of the high-molecular compound 1 in this xylene solution 1 was made to be 0.8% by weight. Then under an atmospheric environment, the xylene solution 1 was applied on the hole injecting layer by a spin coating method to form a thin film for a hole transporting layer having a film thickness of 20 nm, and the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 11 was applied on the hole transporting layer by a spin coating method under an atmospheric environment, to form a thin film for a light emitting layer having a film thickness of 80 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted green light, and had a maximum current efficiency of 10.0 cd/A. In addition, when the device was driven at a constant current at an initial luminance of 12,000 cd/m$^2$, a time during which the luminance became 50% of the initial luminance (luminance half life) was 175 hours.

Example 9 and Comparative Example 11

According to the same manner as in Example 7 except that a green light emitting high-molecular material "Green1300" manufactured by Summation K.K. is used in place of the green light emitting high-molecular material 2, a liquid composition for an organic semiconductor device is manufactured, and stored. By using the liquid composition for an organic semiconductor device after storage, an organic EL device is manufactured in the same manner as in Example 8 (Example 9). In addition, according to the same manner as in Comparative Example 9 except that a green light emitting high-molecular material "Green1300" manufactured by Summation is used in place of the green light emitting high-molecular material 2, a liquid composition for an organic semiconductor device is manufactured, and stored. By using the liquid composition for an organic semiconductor device after storage, an organic EL device is manufactured in the same manner as in Comparative Example 10 (Comparative Example 11). Both of the manufactured devices emit green light. When the properties of those organic EL devices are measured in the same manner as in Example 8, upon constant current driving under at least an initial luminance of 12,000 cd/m$^2$, regarding a time during which a luminance became 50% of the initial luminance (luminance half life), remarkable improvement is observed in the organic EL device of Example 9 as compared with the organic EL device of Comparative Example 11.

Synthesis Example 1

Synthesis of High-Molecular Compound 3

Under an inert atmosphere, a mixture of 9,9-dioctyl-(1,3,2-dioxaborolan-2-yl)-fluorene (21.218 g), 9,9-dioctyl-2,7-dibromofluorene (5.487 g), N,N-bis(4-bromophenyl)-N'N-bis(4-n-butylphenyl)-1,4-phenylenediamine (16.377 g), N,N-bis(4-bromophenyl)-N-(bicydo[4.2.0]octa-1,3,5-triene-3-yl)-amine (2.575 g), methyltrioctyl-ammoniumchloride (Trade name: Aliquat® 336 manufactured by Aldrich) (5.17 g), and toluene (400 ml) as a solvent were heated to about 80° C. Bis(triphenylphosphine)palladium dichloride (56.2 mg) and a 17.5% by weight of aqueous Na$_2$CO3 solution (109 ml) was then added to the reaction solution, and it was stirred with refluxing for about 6 hours while further heated with an oil bath.

Next, phenylboric acid (0.49 g) was added, followed by stirring with refluxing for additional about 2 hours while further heated with an oil bath.

An aqueous layer was removed with separation, and a solution obtained by dissolving sodium N,N-diethyldithiocarbamate trihydrate (24.3 g) in ion exchanged water (240 ml) was added, and stirred for 2 hours while heated to 85° C.

After an organic layer is separated from an aqueous layer, the organic layer was sequentially washed with ion exchanged water (about 520 ml) two times, with 3% by weight of aqueous acetic acid (about 52 ml) two times, and with ion exchanged water (about 520 ml) two times. The organic layer was added dropwise to methanol to let a high-molecular compound precipitate. It was collected by filtration and dried to obtain solid.

The solid was dissolved in toluene (about 1240 ml), and made to pass through a silica gel column and an alumina column through which toluene had been passed in advance. The resulting solution was added dropwise to methanol (about 6200 ml) to let a high-molecular compound precipitate. It was collected by filtration and dried to obtain high-molecular compound 3 (26.23 g).

High-molecular compound 3 had a polystyrene-equivalent number average molecular weight (Mn) and a weight average molecular weight (Mw) of, Mn=$7.8 \times 10^4$ and Mw=$2.6 \times 10^5$, and had a glass transition temperature of 115° C. High-molecular compound 3 was estimated to be a high-molecular compound having the following structural unit in a molar ratio of 62.5:30:7.5 based on the charged ratio of the starting raw materials:

[Chemical Formula 1]

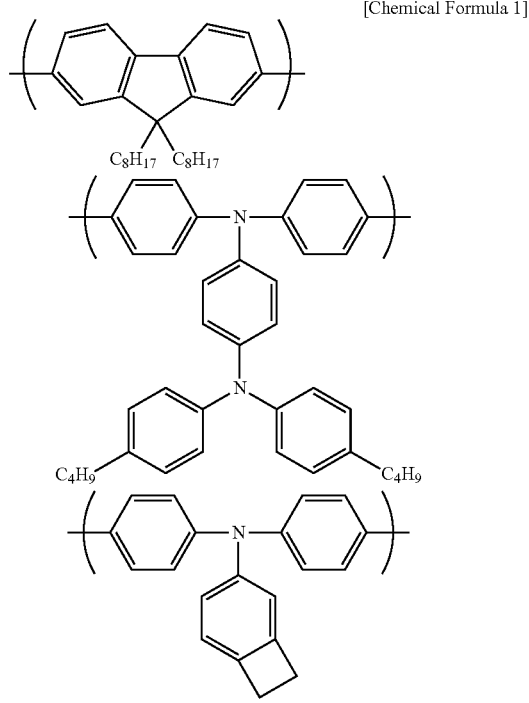

Synthesis Example 2

Synthesis of High-Molecular Compound 4

Under an inert atmosphere, 2,7-dibromo-9,9-di(octyl)fluorene (9.0 g, 16.4 mmol), N,N-bis(4-bromophenyl)-N,N'-bis(4-t-butyl-2,6-dimethylphenyl) 1,4-phenylenediamine (1.3 g, 1.8 mmol), 2,7-bis(4,4,5,5-tetramethyl-1,3,2-dioxaborolane-2-yl)-9,9-di(4-hexylphenyl)fluorene (13.4 g, 18.0 mmol), tetraethylammonium hydoxide (43.0 g, 58.3 mmol), palladium acetate (8 mg, 0.04 mmol), tri(2-methoxyphenyl)phosphine (0.05 g, 0.1 mmol), and toluene (200 ml) were mixed, and the mixture was heated and stirred at 90° C. for 8 hours. Next, phenylboric acid (0.22 mg, 1.8 mmol) was added, and the resulted mixture was stirred for 14 hours. After cooling, an aqueous layer was removed, an aqueous sodium diethyldithiocarbamate solution was added and stirred. Then, an aqueous layer was removed, and an organic layer was washed with water and 3% aqueous acetic acid. The organic layer was added dropwise to methanol to let a high-molecular compound precipitate. The polymer collected by filtration was again dissolved in toluene, and made to pass through a silica gel column and an alumina column. The eluted toluene solution containing the polymer was collected, and the collected toluene solution was added dropwise to methanol to let the polymer precipitate. The precipitated polymer was dried in vacuo at 50° C. to obtain high-molecular compound 4 (12.5 g). By the gel permeation chromatography, the resulted high-molecular compound P1 had a polystyrene-equivalent weight average molecular weight (Mw) of $3.1 \times 10^5$ and a polydispersity index (Mw/Mn) of 2.9.

Based on theoretical estimation from the charged raw materials, the high-molecular compound 4 is a copolymer having the structural unit represented by the formula:

[Chemical Formula 2]

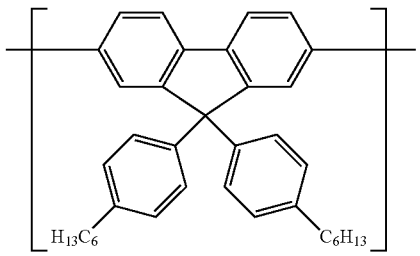

the structural unit represented by the formula:

[Chemical Formula 3]

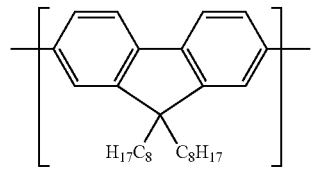

and the structural unit represented by the formula:

[Chemical Formula 4]

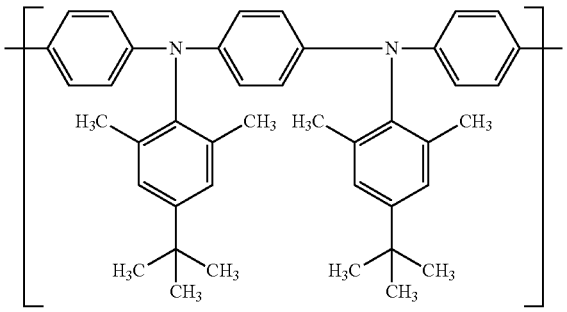

in an molar ratio of 50:45:5.

Example 10

Storage of Liquid Composition for Organic Semiconductor Device 12

Xylene as an organic solvent was added to high-molecular compound 3 as a hole transporting material so that concentration of the high-molecular compound 3 became 0.8% by weight, and it was dissolved at room temperature under an atmospheric environment to prepare a liquid composition for an organic semiconductor device 12.

The resulting liquid composition for an organic semiconductor device 12 was placed in a brown glass bottle, an opening part of the brown glass bottle was covered with a packing in which a surface of polyethylene was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Light having a wavelength of not more than 500 nm was shielded, and the liquid composition was stored under a room temperature (23° C.) environment for 18 hours in the state that the liquid composition for an organic semiconductor device was in contact with the packing.

Example 11

Manufacture of Organic EL Device Using Stored Liquid Composition for Organic Semiconductor Device 12

An organic EL device having the following constitution was manufactured using the liquid composition for an organic semiconductor device 12 after storage.
"Glass substrate/ITO (150 nm)/Baytron P (65 nm)/high-molecular compound 3 (20 nm)/high-molecular compound 4 (65 nm)/Ba (5 nm)/Al (80 nm)"
A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the stored liquid composition for an organic semiconductor device 12 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the high-molecular compound 4 as a light emitting material was dissolved in xylene to prepare xylene solution 2. Concentration of the high-molecular compound 4 in the xylene solution 2 was made to be 1.3% by weight. Then, the xylene solution 2 was applied on the hole transporting layer by a spin coating method under an atmospheric environment, to form a thin film for a light emitting layer having a film thickness of 65 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer.

In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted blue light, and had a maximum current efficiency of 6.5 cd/A. In addition, when the device was driven at a constant current at an initial luminance of 5,000 cd/m$^2$, a time during which the luminance became 50% of the initial luminance (luminance half life) was 36 hours.

Comparative Example 12

Storage of Liquid Composition for Organic Semiconductor Device 13

Xylene as an organic solvent was added to high-molecular compound 3 as a hole transporting material so that concentration of the high-molecular compound 3 became 0.8% by weight, and it was dissolved at room temperature under an atmospheric environment to prepare a liquid composition for an organic semiconductor device 13.

The resulting liquid composition for an organic semiconductor device 13 was placed in a brown glass bottle, an opening part of the brown glass bottle was covered with a packing in which a surface of polyethylene was coated with polypropylene, and a lid made of polypropylene was dosed to seal the brown glass bottle. On this occasion, the packing was placed so that the surface coated with polypropylene covers the opening part of the container body and contacts with the opening-periphery part. The atmosphere in the container was the air. Light having a wavelength of not more than 500 nm was shielded, and the liquid composition was stored under a room temperature (23° C.) environment for 18 hours in the state that the liquid composition for an organic semiconductor device was in contact with the packing.

Comparative Example 13

Manufacture of Organic EL Device Using Stored Liquid Composition for Organic Semiconductor Device 13

An organic EL device having the following constitution was manufactured using the liquid composition for an organic semiconductor device 13 after storage.
"Glass substrate/ITO (150 nm)/Baytron P (65 nm)/high-molecular compound 3 (20 nm)/high-molecular compound 4 (65 nm)/Ba (5 nm)/Al (80 nm)"
A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the stored liquid composition for an organic semiconductor device 13 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the high-molecular compound 4 as a light emitting material was dissolved in xylene to prepare xylene solution 2. Concentration of the high-molecular compound 4 in the xylene solution 2 was made to be 1.3% by weight. Then, the xylene solution 2 was applied on the hole transporting layer by a spin coating method under an atmospheric environment, to form a thin film for a light emitting layer having a film thickness of 65 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted blue light, and had a maximum current efficiency of 6.5 cd/A. In addition, when the device was driven at a constant current at an initial luminance of 5,000 cd/m$^2$, a time during which the luminance became 50% of the initial luminance (luminance half life) was 30 hours.

Example 12

Storage of Liquid Composition for Organic Semiconductor Device 14

Xylene as an organic solvent was added to high-molecular compound 4 as a light emitting material so that concentration of the high-molecular compound 4 became 1.3% by weight, and it was dissolved at room temperature under an atmospheric environment to prepare a liquid composition for an organic semiconductor device 14.

The resulting liquid composition for an organic semiconductor device 14 was placed in a brown glass bottle, an opening part of the brown glass bottle was covered with a packing in which a surface of polyethylene was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Light having a wavelength of not more than 500 nm was shielded, and the liquid composition was stored under a room temperature (23° C.) environment for 18 hours in the state that the liquid composition for an organic semiconductor device was in contact with the packing.

Example 13

Manufacture of Organic EL Device Using Stored Liquid Composition for Organic semiconductor Device 14

An organic EL device having the following constitution was manufactured using the liquid composition for an organic semiconductor device 14 after storage.
"Glass substrate/ITO (150 nm)/Baytron P (65 nm)/high-molecular compound 3 (20 nm)/high-molecular compound 4 (65 nm)/Ba (5 nm)/Al (80 nm)"

A suspension of poly(3,4)ethylenethoxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 14 was applied on the hole transporting layer by a spin coating method under an atmospheric environment, to form a thin film for a light emitting layer having a film thickness of 65 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted blue light, and had a maximum current efficiency of 6.5 cd/A. In addition, when the device was driven at a constant current at an initial luminance of 5,000 cd/m$^2$, a time during which the luminance became 50% of the initial luminance (luminance half life) was 36 hours.

Example 14

Storage of Liquid Composition for Organic Semiconductor Device 15

Xylene as an organic solvent was added to high-molecular compound 4 as a light emitting material so that concentration of the high-molecular compound 4 became 1.3% by weight, and it was dissolved at room temperature under an atmospheric environment to prepare a liquid composition for an organic semiconductor element 15.

The resulting liquid composition for an organic semiconductor device 15 was placed in a brown glass bottle, an opening part of the brown glass bottle was covered with a packing in which a surface of polyethylene was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Light having a wavelength of not more than 500 nm was shielded, and the liquid composition was stored under the environment that outside the container was 45° C. for 18 hours in the state that the liquid composition for organic semiconductor device 15 was in contact with the packing.

Example 15

Manufacture of Organic EL Device Using Stored Liquid Composition for Organic Semiconductor Device 15

An organic EL device having the following constitution was manufactured using the liquid composition for an organic semiconductor device 15 after storage.
"Glass substrate/ITO (150 nm)/Baytron P (65 nm)/high-molecular compound 3 (20 nm)/high-molecular compound 4 (65 nm)/Ba (5 nm)/Al (80 nm)"
A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 15 was applied on the hole transporting layer by a spin coating method under an atmospheric environment, to form a thin film for a light emitting layer having a film thickness of 65 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted blue light, and had a maximum current efficiency of 6.7 cd/A. In addition, when the device was driven at a constant current at an initial luminance of 5,000 cd/m$^2$, a time during which the luminance became 50% of the initial luminance (luminance half life) was 35 hours.

Example 16

Storage of Liquid Composition for Organic Semiconductor Device 16

Xylene as an organic solvent was added to high-molecular compound 4 as a light emitting material so that concentration of the high-molecular compound 4 became 1.3% by weight, and it was dissolved at room temperature under an atmospheric environment to prepare a liquid composition for an organic semiconductor device 16.

The resulting liquid composition for an organic semiconductor device 16 was placed in a brown glass bottle, an opening part of the brown glass bottle was covered with a packing in which a surface of polyethylene was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Light having a wavelength of not more than 500 nm was shielded, and the liquid composition was stored under a room temperature (23° C.) environment for 18 hours in the state that the liquid composition for organic semiconductor device 16 was in contact with the packing.

Example 17

Manufacture of Organic EL Device Using Stored Liquid Composition for Organic Semiconductor device 16

An organic EL device having the following constitution was manufactured using the liquid composition for an organic semiconductor device 16 after storage.
"Glass substrate/ITO (150 nm)/Baytron P (65 nm)/high-molecular compound 3 (20 nm)/high-molecular compound 4 (65 nm)/Ba (5 nm)/Al (80 nm)"
A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 16 was applied on the hole transporting layer by a spin coating method under an atmospheric environment, to form a thin film for a light emitting layer having a film thickness of 65 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted blue light, and had a maximum current efficiency of 6.4 cd/A. In addition, when the device was driven at a constant current at an initial luminance of 5,000 cd/m$^2$, a time during which the luminance became 50% of the initial luminance (luminance half life) was 34 hours.

Comparative Example 14

Storage of Liquid Composition for Organic Semiconductor Device 17

Xylene as an organic solvent was added to high-molecular compound 4 as a light emitting material so that concentration of the high-molecular compound 4 became 1.3% by weight, and it was dissolved at room temperature under an atmospheric environment to prepare a liquid composition for an organic semiconductor device 17.

The resulting liquid composition for an organic semiconductor device 17 was placed in a brown glass bottle, an opening part of the brown glass bottle was covered with a packing in which a surface of polyethylene was coated with polypropylene, and a lid made of polypropylene was closed to seal the brown glass bottle. On this occasion, the packing was placed so that the surface coated with polypropylene covers the opening part of the container body and contacts with the opening-periphery part. The atmosphere in the container was the air. Light having a wavelength of not more than 500 nm was shielded, and the liquid composition was stored under a room temperature (23° C.) environment for 18 hours in the state that the liquid composition for organic semiconductor device 17 was in contact with the packing.

Comparative Example 15

Manufacture of Organic EL Device Using Stored Liquid Composition for Organic Semiconductor Device 17

An organic EL device having the following constitution was manufactured using the liquid composition for an organic semiconductor device 17 after storage.

"Glass substrate/ITO (150 nm)/Baytron P (65 nm)/high-molecular compound 3 (20 nm)/high-molecular compound 4 (65 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 17 was applied on the hole transporting layer by a spin coating method under an atmospheric environment, to form a thin film for a light emitting layer having a film thickness of 65 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted blue light, and had a maximum current efficiency of 6.6 cd/A. In addition, when the device was driven at a constant current at an initial luminance of 5,000 cd/m$^2$, a time during which the luminance became 50% of the initial luminance (luminance half life) was 24 hours.

Synthesis Example 3

Synthesis of Red Phosphorescence Dopant 5

The red phosphorescence dopant 5 represented by the following formula was synthesized according to the method described in Japanese Patent Kokai Publication No. 2006-188673.

[Chemical Formula 5]

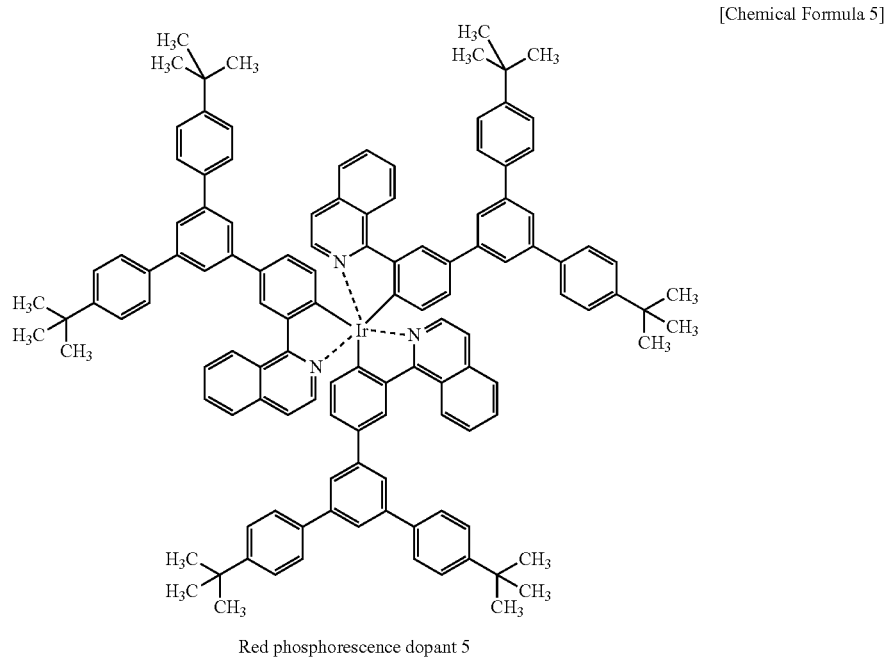

Red phosphorescence dopant 5

Example 18

Storage of Liquid Composition for Organic Semiconductor Device 18

Xylene as an organic solvent was added to a mixed light emitting material 6 obtained by mixing 5% by weight of red phosphorescence dopant 5 and 95% by weight of high-molecular compound 4 so that concentration of the mixed light emitting material became 1.3% by weight, and it was dissolved at room temperature under an atmospheric environment to prepare a liquid composition for an organic semiconductor device 18.

The resulting liquid composition for an organic semiconductor device 18 was placed in a brown glass bottle, an opening part of the brown glass bottle was covered with a packing in which a surface of polyethylene was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Aluminum foil was wound around the brown glass bottle to shield light, and the liquid composition was stored under a room temperature (23° C.) environment for 18 hours in the state that the liquid composition for organic semiconductor device 18 was in contact with the packing.

Example 19

Manufacture of Organic EL Device Using Stored Liquid Composition for Organic Semiconductor Device 18

An organic EL device having the following constitution was manufactured using the liquid composition for an organic semiconductor device 18 after storage.

"Glass substrate/ITO (150 nm)/Baytron P (65 nm)/high-molecular compound 3 (20 nm)/mixed light emitting material 6 (70 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 18 was applied on the hole transporting layer by a spin coating method under an atmospheric environment, to form a thin film for a light emitting layer having a film thickness of 70 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0\times10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted red light, and had a maximum current efficiency of 7.3 cd/A. In addition, when the device was driven at a constant current at an initial luminance of 8,000 cd/m$^2$, a time during which the luminance became 50% of the initial luminance (luminance half life) was 98 hours.

Comparative Example 16

Storage of Liquid Composition for Organic Semiconductor Device 19

Xylene as an organic solvent was added to a mixed light emitting material 6 obtained by mixing 5% by weight of red phosphorescence dopant 5 and 95% by weight of high-molecular compound 4 so that concentration of the mixed light emitting material became 1.3% by weight, and it was dissolved at room temperature under an atmospheric environment to prepare a liquid composition for an organic semiconductor device 19.

The resulting liquid composition for an organic semiconductor device 19 was placed in a brown glass bottle, an opening part of the brown glass bottle was covered with a packing in which a surface of polyethylene was coated with polypropylene, and a lid made of polypropylene was closed to seal the brown glass bottle. On this occasion, the packing was placed so that the surface coated with polypropylene covers the opening part of the container body and contacts with the opening-periphery part. The atmosphere in the container was the air. Aluminum foil was wound around the brown glass bottle to shield light, and the liquid composition was stored under a room temperature (23° C.) environment for 18 hours in the state that the liquid composition for organic semiconductor device 19 was in contact with the packing.

Comparative Example 17

Manufacture of Organic EL Device Using Stored Liquid Composition for Organic Semiconductor Device 19

An organic EL device having the following constitution was manufactured using the liquid composition for an organic semiconductor device 19 after storage.
"Glass substrate/ITO (150 nm)/Baytron P (65 nm)/high-molecular compound 3 (20 nm)/mixed light emitting material 6 (70 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 19 was applied on the hole transporting layer by a spin coating method under an atmospheric environment, to form a thin film for a light emitting layer having a film thickness of 70 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0\times10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted red light, and when the device was driven at a constant current at an initial luminance of 8,000 cd/m$^2$, a time during which the luminance became 50% of the initial luminance (luminance half life) was 47 hours.

Reference Example 3

Manufacture of Organic EL Device Using Stored Liquid Composition for Organic Semiconductor Device 20

Xylene as an organic solvent was added to a mixed light emitting material 6 obtained by mixing 5% by weight of red phosphorescence dopant 5 and 95% by weight of high-molecular compound 4 so that concentration of the mixed light emitting material became 1.3% by weight, and it was dissolved at room temperature under an atmospheric environment to prepare a liquid composition for an organic semiconductor device 20.

An organic EL device having the following constitution was manufactured using the liquid composition for an organic semiconductor device 20 without storing.
"Glass substrate/ITO (150 nm)/Baytron P (65 nm)/high-molecular compound 3 (20 nm)/mixed light emitting material 6 (70 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the liquid composition for an organic semiconductor device 20 that had not been stored was applied on the hole transporting layer by a spin coating method under an atmospheric environment, to form a thin film for a light emitting layer having a film thickness of 70 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted red light, and had a maximum current efficiency of 7.4 cd/A. In addition, when the device was driven at a constant current at an initial luminance of 8,000 cd/m², a time during which the luminance became 50% of the initial luminance (luminance half life) was 97 hours.

Example 20

Storage of Liquid Composition for Organic Semiconductor Device 21

Xylene as an organic solvent was added to a mixed light emitting material 6 obtained by mixing 5% by weight of red phosphorescence dopant 5 and 95% by weight of high-molecular compound 4 so that concentration of the mixed light emitting material became 1.3% by weight, and it was dissolved at room temperature under an atmospheric environment to prepare a liquid composition for an organic semiconductor device 21.

The resulting liquid composition for an organic semiconductor device 21 was placed in a brown glass bottle, an opening part of the brown glass bottle was covered with a packing in which a surface of polyethylene was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Aluminum foil was wound around the brown glass bottle to shield light, and the liquid composition was stored under a room temperature (23° C.) environment for 2 weeks.

Example 21

Manufacture of Organic EL Device Using Stored Liquid Composition for Organic Semiconductor Device 21

An organic EL device having the following constitution was manufactured using the liquid composition for an organic semiconductor device 21 after storage.
"Glass substrate/ITO (150 nm)/Baytron P (65 nm)/high-molecular compound 3 (20 nm)/mixed light emitting material 6 (70 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 21 was applied on the hole transporting layer by a spin coating method under an atmospheric environment, to form a thin film for a light emitting layer having a film thickness of 70 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted red light, and had a maximum current efficiency of 7.0 cd/A. In addition, when the device was driven at a constant current at an initial luminance of 8,000 cd/m², a time during which the luminance became 50% of the initial luminance (luminance half life) was 92 hours.

Example 22

Storage of Liquid Composition for Organic Semiconductor Device 22

Xylene as an organic solvent was added to a mixed light emitting material 6 obtained by mixing 5% by weight of red phosphorescence dopant 5 and 95% by weight of high-molecular compound 4 so that concentration of the mixed light emitting material became 1.3% by weight, and it was dissolved at room temperature under an atmospheric environment to prepare a liquid composition for an organic semiconductor device 22.

The resulting liquid composition for an organic semiconductor device 21 was placed in a brown glass bottle, an opening part of the brown glass bottle was covered with a packing in which a surface of polyethylene was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Aluminum foil was wound around the brown glass bottle to shield light, and the liquid composition was stored under a room temperature (23° C.) environment for 8 weeks.

Example 23

Manufacture of Organic EL Device Using Stored Liquid Composition for Organic Semiconductor Device 22

An organic EL device having the following constitution was manufactured using the liquid composition for an organic semiconductor device 22 after storage.

"Glass substrate/ITO (150 nm)/Baytron P (65 nm)/high-molecular compound 3 (20 nm)/mixed light emitting material 6 (70 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 22 was applied on the hole transporting layer by a spin coating method under an atmospheric environment, to form a thin film for a light emitting layer having a film thickness of 70 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted red light, and had a maximum current efficiency of 7.0 cd/A. In addition, when the device was driven at a constant current at an initial luminance of 8,000 cd/m$^2$, a time during which the luminance became 50% of the initial luminance (luminance half life) was 99 hours.

Comparative Example 18

Storage of Liquid Composition for Organic Semiconductor Device 23

Xylene as an organic solvent was added to a mixed light emitting material 6 obtained by mixing 5% by weight of red phosphorescence dopant 5 and 95% by weight of high-molecular compound 4 so that concentration of the mixed light emitting material became 1.3% by weight, and it was dissolved at room temperature under an atmospheric environment to prepare a liquid composition for an organic semiconductor device 23.

The resulting liquid composition for an organic semiconductor device 23 was placed in a brown glass bottle, an opening part of the brown glass bottle was covered with a packing in which a surface of polyethylene was coated with polypropylene, and a lid made of polypropylene was closed to seal the brown glass bottle. On this occasion, the packing was placed so that the surface coated with polypropylene covers the opening part of the container body and contacts with the opening-periphery part. The atmosphere in the container was the air. Aluminum foil was wound around the brown glass bottle to shield light, and the liquid composition was stored under a room temperature (23° C.) environment for 8 weeks.

Comparative Example 19

Manufacture of Organic EL Device Using Stored Liquid Composition for Organic Semiconductor Device 23

An organic EL device having the following constitution was manufactured using the liquid composition for an organic semiconductor device 23 after storage.

"Glass substrate/ITO (150 nm)/Baytron P (65 nm)/high-molecular compound 3 (20 nm)/mixed light emitting material 6 (70 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 23 was applied on the hole transporting layer by a spin coating method under an atmospheric environment, to form a thin film for a light emitting layer having a film thickness of 70 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted red light, and when the device was driven at a constant current at an initial luminance of 8,000 cd/m$^2$, a time during which the luminance became 50% of the initial luminance (luminance half life) was 31 hours.

Reference Example 4

Manufacture of Organic EL Device Using Stored Liquid Composition for Organic Semiconductor Device 24

A mixed solvent obtained by mixing 80% by volume of cyclohexylbenzene and 20% by volume of 4-methylanisole as an organic solvent was added to a mixed light emitting material 6 obtained by mixing 5% by weight of red phosphorescence dopant 5 and 95% by weight of high-molecular compound 4 so that concentration of the mixed light emitting material became 2.0% by weight, and it was dissolved at room temperature under an atmospheric environment to prepare a liquid composition for an organic semiconductor device 24.

An organic EL device having the following constitution was manufactured using the liquid composition for an organic semiconductor device 24 without storing.

"Glass substrate/ITO (150 nm)/Baytron P (65 nm)/high-molecular compound 3 (20 nm)/mixed light emitting material 6 (70 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the liquid composition for an organic semiconductor device 24 that had not been stored was applied on the hole transporting layer by a spin coating method under an atmospheric environment, to form a thin film for a light emitting layer having a film thickness of 70 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted red light, and had a maximum current efficiency of 6.8 cd/A. In addition, when the device was driven at a constant current at an initial luminance of 8,000 cd/m$^2$, a time during which the luminance became 50% of the initial luminance (luminance half life) was 71 hours.

Example 24

Storage of Liquid Composition for Organic Semiconductor Device 25

A mixed solvent obtained by mixing 80% by volume of cyclohexylbenzene and 20% by volume of 4-methylanisole as an organic solvent was added to a mixed light emitting material 6 obtained by mixing 5% by weight of red phosphorescence dopant 5 and 95% by weight of high-molecular compound 4 so that concentration of the mixed light emitting material became 2.0% by weight, and it was dissolved at room temperature under an atmospheric environment to prepare a liquid composition for an organic semiconductor device 25.

The resulting liquid composition for an organic semiconductor device 25 was placed in a brown glass bottle, an opening part of the brown glass bottle was covered with a packing in which a surface of polyethylene was coated with polytetrafluoroethylene, and a lid made of polypropylene was closed to seal the brown glass bottle. On this occasion, the packing was placed so that the surface coated with polytetrafluoroethylene covers the opening part of the container body and contacts with the opening-periphery part. The atmosphere in the container was the air. Aluminum foil was wound around the brown glass bottle to shield light, and the liquid composition was stored under a room temperature (23° C.) environment for 2 weeks.

Example 25

Manufacture of Organic EL Device Using Stored Liquid Composition for Organic Semiconductor Device 25

An organic EL device having the following constitution was manufactured using the liquid composition for an organic semiconductor device 25 after storage.

"Glass substrate/ITO (150 nm)/Baytron P (65 nm)/high-molecular compound 3 (20 nm)/mixed light emitting material 6 (70 nm)/Ba (5 nm)/Al (80 nm)"

A suspension of poly(3,4)ethylenedioxythiophene/polystyrene sulfonic acid (manufactured by Starck; Baytron P) was applied on a glass substrate on which an ITO film (anode) having a thickness of 150 nm had been formed by a sputtering method, by a spin coating method to form a thin film having a thickness of 65 nm, and the thin film was further baked by heating on a hot plate at 200° C. for 10 minutes, to obtain a hole injecting layer. In addition, in formation of the hole injecting layer, the step of forming a thin film and the step of baking the thin film were performed under an atmospheric environment.

Then, the high-molecular compound 3 as a hole transporting material was dissolved in xylene to prepare xylene solution 3. Concentration of the high-molecular compound 3 in the xylene solution 3 was made to be 0.8% by weight. Then, the xylene solution 3 was applied on the hole injecting layer by a spin coating method under an atmospheric environment, to form a thin film for a hole transporting layer having a film thickness of 20 nm. Further, the thin film was baked by heating at 180° C. for 1 hour under a nitrogen atmosphere in which an oxygen concentration and a moisture concentration were controlled at not more than 10 ppm as expressed by a volumetric ratio, respectively, to obtain a hole transporting layer.

Then, the stored liquid composition for an organic semiconductor device 25 was applied on the hole transporting layer by a spin coating method under an atmospheric environment, to form a thin film for a light emitting layer having a film thickness of 70 nm. Further, the thin film was baked by heating at 130° C. for 10 minutes under an atmosphere in which an oxygen concentration and a moisture concentration were controlled at not more than 10 ppm as expressed by a volumetric ratio, respectively, to obtain a light emitting layer. In addition, in formation of the hole transporting layer and the light emitting layer, pressure in the step of forming a thin film and the step of baking the thin film was the atmospheric pressure.

Then, after the pressure was reduced to not more than $1.0 \times 10^{-4}$ Pa, as a cathode, barium was deposited at a thickness of about 5 nm and, then, aluminum was deposited at a thickness of about 80 nm. After deposition, sealing was performed using a glass substrate to manufacture an organic EL device.

The manufactured organic EL device emitted red light, and had a maximum current efficiency of 6.8 cd/A. In addition, when the device was driven at a constant current at an initial luminance of 8,000 cd/m$^2$, a time during which the luminance became 50% of the initial luminance (luminance half life) was 70 hours.

| DESCRIPTION OF REFERENCE NUMERALS | |
|---|---|
| 1, 1' | Organic EL device, |
| 2 | Substrate, |
| 3 | Anode, |
| 4 | First organic layer, |
| 5 | Second organic layer, |
| 6 | Organic layer, |
| 6' | Third organic layer, |
| 7 | Cathode, |
| 11 | Container body, |
| 12 | Packing, |
| 13 | Lid, |
| 14 | Opening-periphery part, |
| 15 | Opening part, |
| 16 | Cavity. |

The invention claimed is:

1. A method of storing a liquid composition for an organic semiconductor device, the method comprising the step of storing the liquid composition for the organic semiconductor device in a storage container having a container body which defines a cavity as a space for storing therein a substance to be stored and which has an opening-periphery part defining an opening part for connecting the cavity and the outside of the container, a packing which covers the opening part of the container body, and a lid, wherein
   the liquid composition comprises an organic compound that is solid at 1 atm and 25° C. and an organic solvent that is liquid at 1 atm and 25° C.,
   the container body has an inner wall formed of a material which does not chemically act on the organic solvent and the organic compound, and
   a surface of the packing, which surface covers the opening part and comes into contact with the opening-periphery part when the packing and the lid are mounted to the container body to form a sealed state, is formed of a material comprising a resin having fluorine atom.

2. The method according to claim 1, wherein the organic semiconductor device is an organic electroluminescent device.

3. The method according to claim 1 wherein the material forming the inner surface of the container body is glass.

4. The method according to claim 1, wherein the organic compound is a high-molecular compound.

5. The method according to claim 1, wherein the organic solvent is a compound composed of two or more elements selected from the group consisting of carbon, hydrogen, oxygen and nitrogen.

6. The method according to claim 1, wherein the organic compound is contained in the liquid composition in a proportion of not less than 0.01% by weight and not more than 5.0% by weight based on the total weight of the liquid composition.

7. The method according to claim 1, wherein the resin having fluorine atom is at least one selected from the group consisting of polymonofluoroethylene, polydifluoroethylene, polytrifluoroethylene, polytetrafluoroethylene and a tetrafluoroethylene/hexafuoropropylene copolymer.

8. The method according to claim 1, wherein the liquid composition is stored at a temperature of not lower than 0° C. and not higher than 50° C.

9. The method according to claim 1, wherein the liquid composition is stored with light having a wavelength of not longer than 380 nm being shielded.

10. The method according to claim 1, wherein the liquid composition is stored under an atmosphere containing an inert gas.

11. The method according to claim 1, wherein the organic compound is an organic compound to be used for forming a light emitting layer of an organic electroluminescent device.

12. The method according to claim 1, wherein the organic compound is an organic compound to be used for forming a charge transporting layer of an organic electroluminescent device.

* * * * *